United States Patent
Xia et al.

(10) Patent No.: US 12,052,871 B2
(45) Date of Patent: Jul. 30, 2024

(54) THREE-DIMENSIONAL MEMORY AND FABRICATION METHOD THEREOF

(71) Applicant: Yangtze Memory Technologies Co., Ltd., Hubei (CN)

(72) Inventors: Ji Xia, Hubei (CN); Zongliang Huo, Hubei (CN); Wenbin Zhou, Hubei (CN); Wei Xu, Hubei (CN); Pan Huang, Hubei (CN); Wenxiang Xu, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 83 days.

(21) Appl. No.: 17/496,031

(22) Filed: Oct. 7, 2021

(65) Prior Publication Data

US 2022/0028890 A1 Jan. 27, 2022

Related U.S. Application Data

(60) Division of application No. 16/729,827, filed on Dec. 30, 2019, now Pat. No. 11,271,007, which is a
(Continued)

(51) Int. Cl.
*H10B 43/27* (2023.01)
*H10B 43/10* (2023.01)
*H10B 43/35* (2023.01)

(52) U.S. Cl.
CPC ............ *H10B 43/27* (2023.02); *H10B 43/10* (2023.02); *H10B 43/35* (2023.02)

(58) Field of Classification Search
CPC ................................ H10B 43/27; H10B 43/20
See application file for complete search history.

(56) References Cited

U.S. PATENT DOCUMENTS

| 9,230,982 B1 | 1/2016 | Yuan et al. |
| 9,679,907 B1 | 6/2017 | Kaneko |

(Continued)

FOREIGN PATENT DOCUMENTS

| CN | 107833892 A | 3/2018 |
| CN | 109417078 A | 3/2019 |

(Continued)

OTHER PUBLICATIONS

International Search Report and Written Opinion of the International Searching Authority directed to related International Patent Application No. PCT/CN2019/103221, dated May 26, 2020; 9 pages.

*Primary Examiner* — Christopher A Johnson
(74) *Attorney, Agent, or Firm* — Sterne, Kessler, Goldstein & Fox P.L.L.C.

(57) ABSTRACT

Embodiments of a three-dimensional (3D) memory device and fabrication methods are disclosed. In some embodiments, the method for forming the 3D memory device includes forming an alternating dielectric stack on a substrate, and forming channel holes that penetrate the alternating dielectric stack and expose at least a portion of the substrate. The method further includes forming top select gate openings that penetrate vertically an upper portion of the alternating dielectric stack and extend laterally. The method also includes forming slit openings parallel to the top select gate openings, wherein the slit openings penetrate vertically the alternating dielectric stack. The method also includes replacing the alternating dielectric stack with a film stack of alternating conductive and dielectric layers, forming top select gate cuts in the top select gate openings, and forming slit structures in the slit openings.

20 Claims, 13 Drawing Sheets

Related U.S. Application Data continuation of application No. PCT/CN2019/103221, filed on Aug. 29, 2019.

(56) References Cited

U.S. PATENT DOCUMENTS

| | | |
|---|---|---|
| 10,050,054 B2 | 8/2018 | Zhang et al. |
| 10,319,740 B2 | 6/2019 | Yoshimizu |
| 10,608,013 B1 | 3/2020 | Xiao |
| 10,950,623 B2 | 3/2021 | Song et al. |
| 2012/0119287 A1* | 5/2012 | Park ............... H10B 43/27 257/329 |
| 2014/0063890 A1 | 3/2014 | Lee et al. |
| 2015/0200203 A1 | 7/2015 | Jang et al. |
| 2015/0270277 A1 | 9/2015 | Chiu et al. |
| 2018/0097009 A1* | 4/2018 | Zhang ............... H10B 43/27 |
| 2019/0244933 A1 | 8/2019 | Or-Bach et al. |
| 2019/0252396 A1 | 8/2019 | Mushiga et al. |
| 2020/0135753 A1 | 4/2020 | Zhang |
| 2021/0066337 A1 | 3/2021 | Xia et al. |

FOREIGN PATENT DOCUMENTS

| | | |
|---|---|---|
| CN | 109564922 A | 4/2019 |
| CN | 109690776 A | 4/2019 |
| CN | 109786382 A | 5/2019 |
| CN | 109791932 A | 5/2019 |
| CN | 109817627 A | 5/2019 |
| CN | 110176461 A | 8/2019 |
| TW | 201931569 A | 8/2019 |
| TW | I 667774 B | 8/2019 |
| WO | WO 2019/005219 A1 | 1/2019 |
| WO | WO 2020/252894 A1 | 12/2020 |

\* cited by examiner

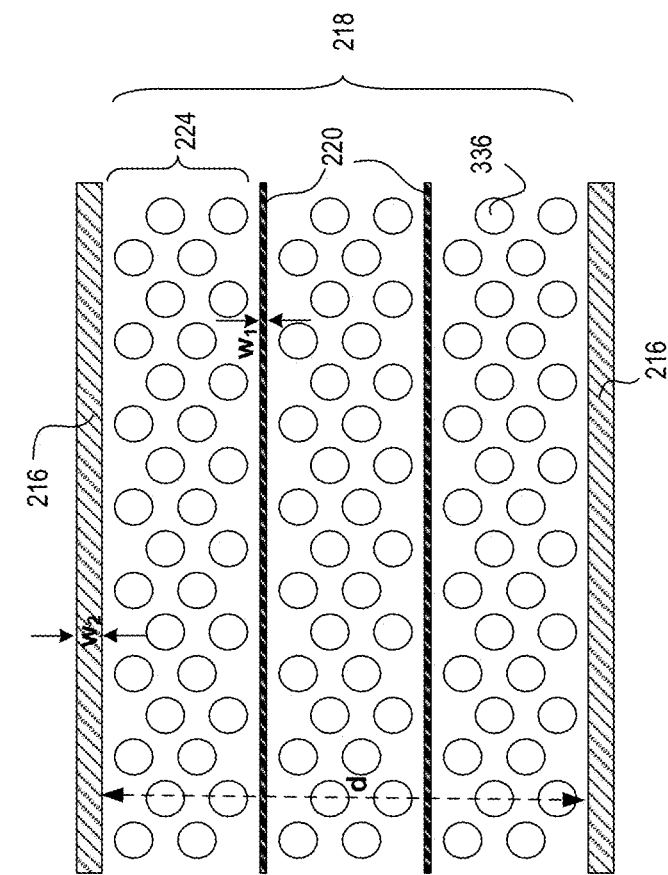
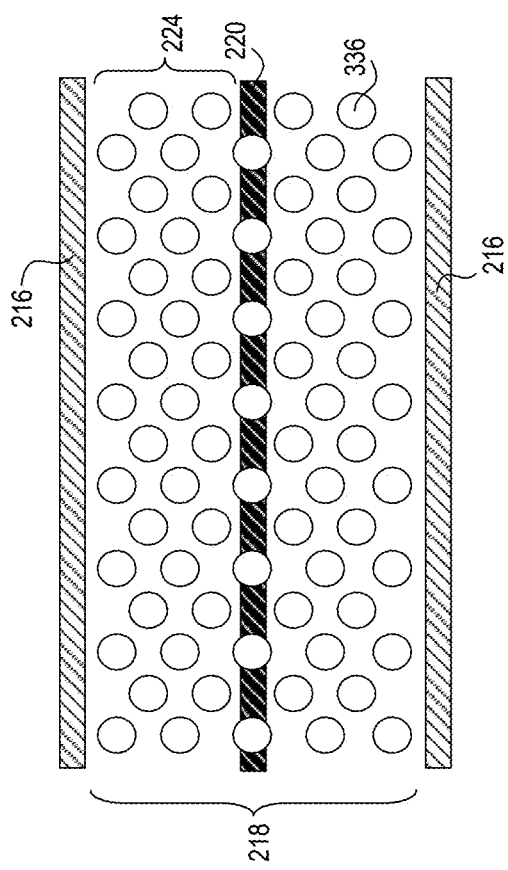
Fig. 4B
Fig. 4A

THREE-DIMENSIONAL MEMORY AND FABRICATION METHOD THEREOF

INCORPORATION BY REFERENCE

This application is a divisional of U.S. patent application Ser. No. 16/729,827, filed on Dec. 30, 2019 and titled "Three-Dimensional Memory and Fabrication Method Thereof," which claims priority to PCT/CN2019/103221 filed on Aug. 29, 2019, all of which are incorporated herein by reference in their entirety.

TECHNICAL FIELD

The present disclosure generally relates to the field of semiconductor technology, and more particularly, to a method for forming a three-dimensional (3D) memory.

BACKGROUND

As memory devices are shrinking to smaller die size to reduce manufacturing cost and increase storage density, scaling of planar memory cells faces challenges due to process technology limitations and reliability issues. A three-dimensional (3D) memory architecture can address the density and performance limitation in planar memory cells.

In a 3D memory, slit structures and top select gate (TSG) cuts are used to divide a memory block into smaller storage units such as memory fingers and memory slices. As the vertical stack of word lines or memory cells increase for higher storage capacity, the aspect ratio of a memory finger increases too. During the fabrication of slit structures and top select gate cuts, the 3D memory may have problems such as structure collapse or flip-over. A need exists for an improvement in design, structure and method for a 3D memory to achieve high density and high performance.

BRIEF SUMMARY

Embodiments of a three-dimensional (3D) memory device and methods for forming the same are described in the present disclosure.

One aspect of the present disclosure provides a method for forming a three-dimensional (3D) memory device that includes forming an alternating dielectric stack on a substrate. The method for forming the 3D memory device also includes forming a plurality of channel holes, wherein the plurality of channel holes penetrate the alternating dielectric stack vertically, in a direction perpendicular to the substrate, and expose at least a portion of the substrate. The method for forming the 3D memory device further includes forming a plurality of top select gate openings that penetrate vertically an upper portion of the alternating dielectric stack and extend laterally in a direction parallel to the substrate. The method for forming the 3D memory device also includes forming a plurality of slit openings parallel to the plurality of top select gate openings, wherein the plurality of slit openings penetrate vertically the alternating dielectric stack and expose at least a portion of the substrate. The method for forming the 3D memory device further includes replacing the alternating dielectric stack with a film stack of alternating conductive and dielectric layers, forming a plurality of top select gate cuts in the plurality of top select gate openings, and forming a plurality of slit structures in the plurality of slit openings.

In some embodiments, the method for forming the 3D memory device further includes forming the plurality of channel holes arranged in rows, wherein each row of the channel holes is staggered from adjacent rows of the channel holes. The method for forming the 3D memory device also includes forming the plurality of top select gate openings with N number of rows of the channel holes between adjacent top select gate openings, N being a whole number greater than one. The method for forming the 3D memory device further includes forming the plurality of slit openings with M number of the top select gate cuts between adjacent slit openings, M being a whole number greater than one.

In some embodiments, forming the plurality of top select gate cuts and slit structures includes disposing an insulating film inside the plurality of top select gate openings and slit openings simultaneously, wherein the insulating film is configured to fill up the plurality of top select gate openings to form the plurality of top select gate cuts and cover a sidewall of at least one of the plurality of slit openings to form a slit trench. Forming the plurality of top select gate cuts and slit structures also includes removing the insulating film from a bottom of the slit trench to expose at least a portion of the substrate, and forming a conductive core inside the slit trench, wherein the conductive core is in contact with the substrate to function as an array common source. In some embodiments, the insulating film is further configured to fill up at least one of the plurality of slit openings to form a gate line slit. In some embodiments, forming the conductive core inside the slit trench including disposing a conductive material inside the slit trench, and removing excess conductive material outside the slit trench. In some embodiments, removing excess conductive material outside the slit trench comprising chemical mechanical polishing.

In some embodiments, forming the alternating dielectric stack includes forming a plurality of dielectric layer pairs stacked vertically in the direction perpendicular to the substrate, wherein each dielectric layer pair comprises a first dielectric layer and a second dielectric layer that is different from the first dielectric layer.

In some embodiments, the method for forming the 3D memory device further includes, after forming the plurality of channel holes, disposing sequentially a memory film, a channel layer and a core filling film inside the plurality of channel holes. In some embodiments, prior to disposing the memory film, an epitaxial layer is disposed on the exposed portion of substrate inside the plurality of channel holes, wherein the epitaxial layer is connected with the channel layer. In some embodiments, after forming the core filling film, a top channel structure is formed in an upper portion of the channel holes, wherein the top channel structure is connected with the channel layer.

In some embodiments, replacing the alternating dielectric stack with the film stack of alternating conductive and dielectric layers includes removing the second dielectric layers of the alternating dielectric stack to form lateral trenches, and disposing conductive layers inside the lateral trenches.

Another aspect of the present disclosure provides a three-dimensional (3D) memory device that includes a film stack of alternating conductive and dielectric layers disposed on a substrate. The 3D memory device also includes a plurality of memory strings and slit structures extending vertically, in a direction perpendicular to the substrate, penetrating through the film stack of alternating conductive and dielectric layers, wherein the plurality of slit structures extend laterally, in a direction parallel to the substrate and the plurality of memory strings are arranged in rows, each row of memory strings staggered from adjacent rows of memory strings. The 3D memory device further includes two or more top select gate cuts disposed between adjacent slit structures, wherein the two or more top select gate cuts penetrate vertically through an upper portion of the film stack of alternating conductive and dielectric layers, and wherein the two or more top select gate cuts extend parallel to the plurality of slit structures.

In some embodiments, the film stack of alternating conductive and dielectric layers includes a plurality of conductive and dielectric layer pairs stacked vertically, wherein each conductive and dielectric pair includes a dielectric layer and a conductive layer.

In some embodiments, the plurality of slit structures and the two or more top select gate cuts include an insulating film disposed simultaneously. In some embodiments, at least one of the slit structures further includes a conductive core, wherein the conductive core is in contact with the substrate.

In some embodiments, each memory string includes an epitaxial layer disposed at a bottom of each memory string and a core filling film disposed in a center of each memory string. Each memory string also includes a channel layer covering a sidewall of the core filling film, wherein the channel layer is in contact with the epitaxial layer. Each memory string further includes a memory film covering a sidewall of the channel layer, and a top channel structure disposed on an upper portion of each memory string, wherein the top channel structure is in contact with the channel layer.

In some embodiments, the plurality of slit structures are configured to divide a memory block into memory fingers, each memory finger having M number of the top select gate cuts with M being a whole number greater than one. In some embodiments, the top select gate cuts are configured to divide each memory finger into memory slices, each memory slice having N number of rows of the memory strings with N being a whole number greater than one.

In some embodiments, the two or more top select gate cuts include a width smaller than a diameter of the plurality of the memory strings.

In some embodiments, the two or more top select gate cuts penetrate vertically through top three conductive and dielectric pairs of the film stack of alternating conductive and dielectric layers.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

FIG. 4A illustrates a top-down view of an exemplary 3D memory device.

FIG. 4B illustrates a top-down view of an exemplary 3D memory device, in accordance with some embodiments of the present disclosure.

Figure 1:
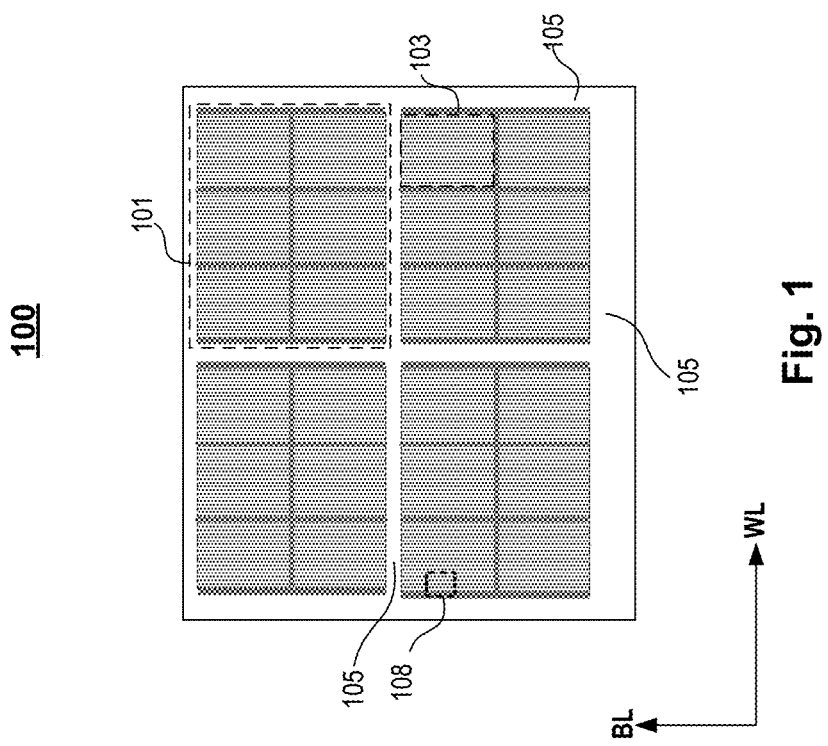
FIG. 1 illustrates a schematic top-down view of an exemplary three-dimensional (3D) memory die, according to some embodiments of the present disclosure.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something, but also includes the meaning of "on" something with an intermediate feature or a layer therebetween. Moreover, "above" or "over" not only means "above" or "over" something, but can also include the meaning it is "above" or "over" something with no intermediate feature or layer therebetween (i.e., directly on something).

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or process step in addition to the orientation depicted in the figures. The apparatus can be otherwise oriented (rotated 90 degrees or at other orientations) and the spatially relative descriptors used herein can likewise be interpreted accordingly.

As used herein, the term "substrate" refers to a material onto which subsequent material layers are added. The substrate includes a "top" surface and a "bottom" surface. The top surface of the substrate is typically where a semiconductor device is formed, and therefore the semiconductor device is formed at a top side of the substrate unless stated otherwise. The bottom surface is opposite to the top surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductive and contact layers (in which contacts, interconnect lines, and/or vertical interconnect accesses (VIAs) are formed) and one or more dielectric layers.

In the present disclosure, for ease of description, "tier" is used to refer to elements of substantially the same height along the vertical direction. For example, a word line and the underlying gate dielectric layer can be referred to as "a tier," a word line and the underlying insulating layer can together be referred to as "a tier," word lines of substantially the same height can be referred to as "a tier of word lines" or similar, and so on.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

In the present disclosure, the term "horizontal/horizontally/lateral/laterally" means nominally parallel to a lateral surface of a substrate, and the term "vertical" or "vertically" means nominally perpendicular to the lateral surface of a substrate.

As used herein, the term "3D memory" refers to a three-dimensional (3D) semiconductor device with vertically oriented strings of memory cell transistors (referred to herein as "memory strings," such as NAND strings) on a laterally-oriented substrate so that the memory strings extend in the vertical direction with respect to the substrate.

Various embodiments in accordance with the present disclosure provide structures and fabricating methods for slit structures and top select gate (TSG) cuts for a high-stacked 3D memory device, where structural stability can be improved without sacrificing memory cell density or performance.

FIG. 1 illustrates a top-down view of an exemplary three-dimensional (3D) memory device 100, according to some embodiments of the present disclosure. The 3D memory device 100 can be a memory chip (package), a memory die or any portion of a memory die, and can include one or more memory planes 101, each of which can include a plurality of memory blocks 103. Identical and concurrent operations can take place at each memory plane 101. The memory block 103, which can be megabytes (MB) in size, is the smallest size to carry out erase operations. Shown in FIG. 1, the exemplary 3D memory device 100 includes four memory planes 101 and each memory plane 101 includes six memory blocks 103. Each memory block 103 can include a plurality of memory cells, where each memory cell can be addressed through interconnections such as bit lines and word lines. The bit lines and word lines can be laid out perpendicularly (e.g., in rows and columns, respectively), forming an array of metal lines. The direction of bit lines and word lines are labeled as "BL" and "WL" in FIG. 1. In this disclosure, memory block 103 is also referred to as a "memory array" or "array." The memory array is the core area in a memory device, performing storage functions.

The 3D memory device 100 also includes a periphery region 105, an area surrounding memory planes 101. The periphery region 105 contains many digital, analog, and/or mixed-signal circuits to support functions of the memory array, for example, page buffers, row and column decoders and sense amplifiers. Peripheral circuits use active and/or passive semiconductor devices, such as transistors, diodes, capacitors, resistors, etc., as would be apparent to a person of ordinary skill in the art.

It is noted that, the arrangement of the memory planes 101 in the 3D memory device 100 and the arrangement of the memory blocks 103 in each memory plane 101 illustrated in FIG. 1 are only used as an example, which does not limit the scope of the present disclosure.

Figure 2:
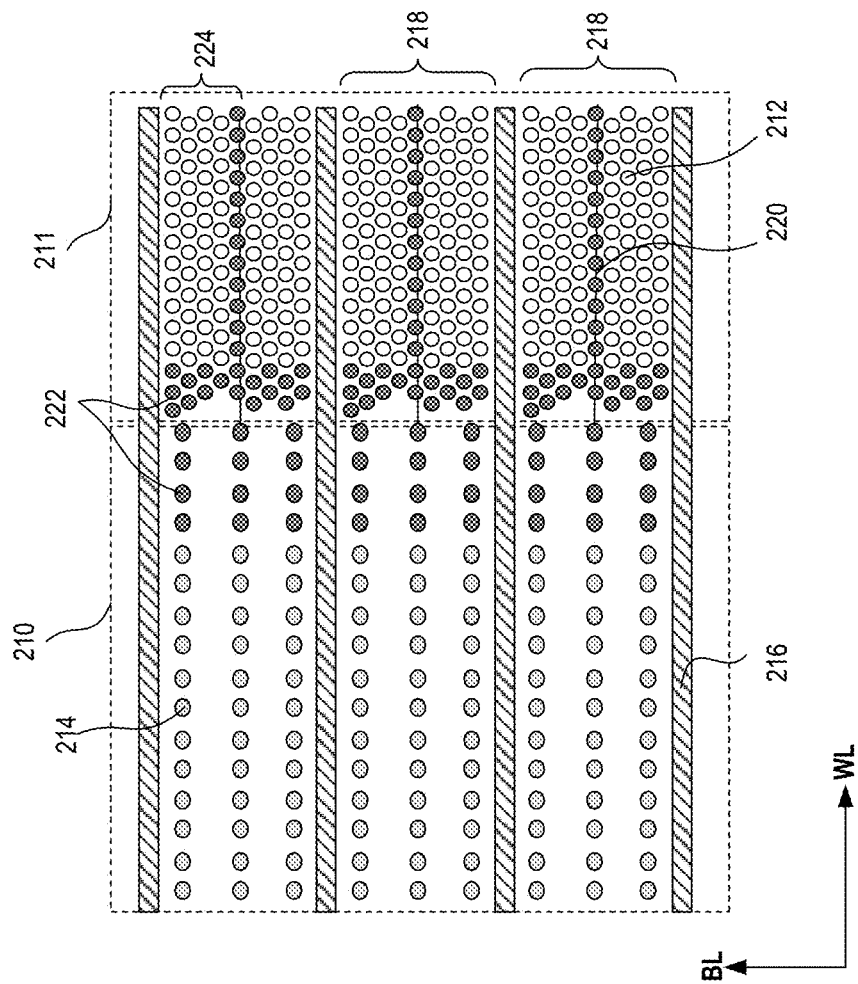
FIG. 2 illustrates a schematic top-down view of a region of 3D memory die, according to some embodiments of the present disclosure.

Referring to FIG. 2, an enlarged top-down view of a region 108 in FIG. 1 is illustrated, according to some embodiments of the present disclosure. The region 108 of the 3D memory device 100 can include a staircase region 210 and a channel structure region 211. The channel structure region 211 can include an array of memory strings 212, each including a plurality of stacked memory cells. The staircase region 210 can include a staircase structure and an array of contact structures 214 formed on the staircase structure. In some embodiments, a plurality of slit structures 216, extending in WL direction across the channel structure region 211 and the staircase region 210, can divide a memory block into multiple memory fingers 218. At least some slit structures 216 can function as the common source contact for an array of memory strings 212 in channel structure regions 211. A top select gate cut 220 can be disposed, for example, in the middle of each memory finger 218 to divide a top select gate (TSG) of the memory finger 218 into two portions, and thereby can divide a memory finger into two memory slices 224, where memory cells in a memory slice 224 that share the same word line form a programmable (read/write) memory page. While erase operation of a 3D NAND memory can be carried out at memory block level, read and write operations can be carried out at memory page level. A memory page can be kilobytes (KB) in size. In some embodiments, region 108 also includes dummy memory strings 222 for process variation control during fabrication and/or for additional mechanical support.

Figure 3:
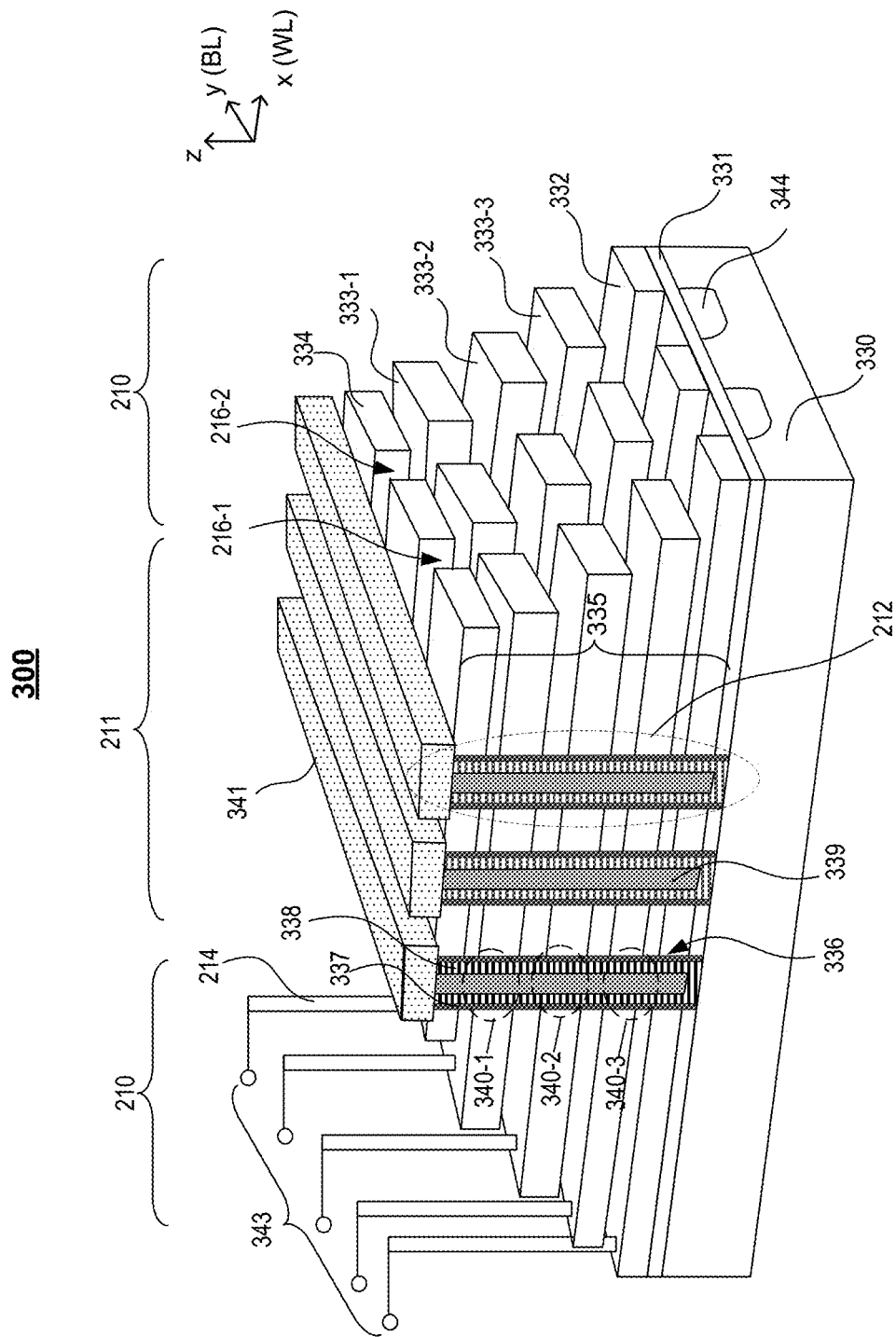
FIG. 3 illustrates a perspective view of a portion of an exemplary 3D memory array structure, in accordance with some embodiments of the present disclosure.

FIG. 3 illustrates a perspective view of a portion of an exemplary three-dimensional (3D) memory array structure 300, according to some embodiments of the present disclosure. The memory array structure 300 includes a substrate 330, an insulating film 331 over the substrate 330, a tier of lower select gates (LSGs) 332 over the insulating film 331, and a plurality of tiers of control gates 333, also referred to as "word lines (WLs)," stacking on top of the LSGs 332 to form a film stack 335 of alternating conductive and dielectric layers. The dielectric layers adjacent to the tiers of control gates are not shown in FIG. 3 for clarity.

The control gates of each tier are separated by slit structures 216-1 and 216-2 through the film stack 335. The memory array structure 300 also includes a tier of top select gates (TSGs) 334 over the stack of control gates 333. The stack of TSG 334, control gates 333 and LSG 332 is also referred to as "gate electrodes." The memory array structure 300 further includes memory strings 212 and doped source line regions 344 in portions of substrate 330 between adjacent LSGs 332. Each memory strings 212 includes a channel hole 336 extending through the insulating film 331 and the film stack 335 of alternating conductive and dielectric layers. Memory strings 212 also includes a memory film 337 on a sidewall of the channel hole 336, a channel layer 338 over the memory film 337, and a core filling film 339 surrounded by the channel layer 338. A memory cell 340 can be formed at the intersection of the control gate 333 and the memory string 212. The memory array structure 300 further includes a plurality of bit lines (BLs) 341 connected with the memory strings 212 over the TSGs 334. The memory array structure 300 also includes a plurality of metal interconnect lines 343 connected with the gate electrodes through a plurality of contact structures 214. The edge of the film stack 335 is configured in a shape of staircase to allow an electrical connection to each tier of the gate electrodes.

In FIG. 3, for illustrative purposes, three tiers of control gates 333-1, 333-2, and 333-3 are shown together with one tier of TSG 334 and one tier of LSG 332. In this example, each memory string 212 can include three memory cells 340-1, 340-2 and 340-3, corresponding to the control gates 333-1, 333-2 and 333-3, respectively. In some embodiments, the number of control gates and the number of memory cells can be more than three to increase storage capacity. The memory array structure 300 can also include other structures, for example, TSG cut, common source contact and dummy memory string. These structures are not shown in FIG. 3 for simplicity.

FIG. 4A illustrates a top-down schematic diagram of a 3D memory device 400A. As shown, in some existing 3D NAND memory devices, the slit structures 216 can be extended in parallel along a lateral direction to divide the memory block into multiple memory fingers (e.g., the memory fingers 218). Each memory finger 218 can include nine rows of channel holes 336, for example, arranged in a staggered manner between adjacent slit structures 216. A top select gate (TSG) cut 220 is located in the middle row of the channel holes to separate the memory finger 218 into two equal parts (two memory slices 224). Due to the size limitation, the top select gate cut 220 goes across the fifth row of the nine rows of channel holes 336 in this example. As such in this example, after completing the 3D memory fabrication, in each memory finger 218, there will be eight rows of memory strings 212 and one row of dummy memory strings 222, one memory string (or one dummy memory string) corresponding to one channel hole.

To achieve higher storage density, the number of vertical WL stacks of a 3D memory or the number of memory cells per memory string has been greatly increased, for example, from 24 stacked WL layers (i.e. 24L) to 128 layers or more. As such, the aspect ratio of each memory finger 218 has also been greatly increased. During the formation of the slit structures 216, the entire stack of WL layers is etched through, which may cause structural instability in memory fingers 218, for example, flip-overs, collapses, etc. As such, needs exist to form memory fingers mechanically strong enough for a large number of stacked WL layers. FIGS. 4B and 5-12 illustrate methods and structures for forming TSG cuts and slid structures for a 3D memory device with robust memory fingers and improved memory cell density.

FIG. 4B illustrates a top-down schematic diagram of a 3D memory device 400B, according to some embodiments of the present disclosure. As shown in FIG. 4B, twelve rows of channel holes 336 can be arranged in a staggered manner in the memory finger 218, between neighboring slit structures 216. Two TSG cuts 220 can be disposed in the memory finger 218 to divide the channel holes into three groups of equal number of rows and form three memory slices 224 in the memory finger 218. Each memory slice 224 includes four rows of channel holes 336. In some embodiments, the TSG cuts 220 can be placed in between and without crossing the channel holes 336.

In some embodiments, the numbers of TSG cuts 220 and channel holes 336 in the memory finger 218 are not so limited. For example, each memory finger 218 can have M number of TSG cuts 220 to form (M+1) number of memory slices 224. Each memory slice 224 can have N number rows of channel holes 336. In the other words, each memory finger 218 can have (M+1)·N number rows of channel holes 336. Here M and N are whole numbers. As such, after completing the 3D memory fabrication, in each memory finger 218, there can be (M+1)·N rows of memory strings 212, each memory string corresponding to one channel hole.

The TSG cut 220 can extend laterally in the x-direction. In some embodiments, as shown in FIG. 4B, the TSG cut 220 can have a rectangular shape. In some other embodiments, the TSG cut 220 can have a wavy shape (not shown). In some embodiments, a width "$w_1$" of the TSG cut 220 can be kept less than a diameter of the channel hole 336. For example, the width "$w_1$" of the TSG cut 220 can be in a range from about 10 nm to about 200 nm. As such, without occupying the location of a row of channel holes 336, the TSG cut 220 can be arranged between adjacent rows of channel holes 336. In the other words, the TSG cut 220 can be distant from the memory strings. For example, the design of nine rows of channel holes 336 in the memory finger 218 in FIG. 4A can be changed to the design of twelve rows of channel holes 336 in FIG. 4B. In some embodiments, the width "$w_1$" of the TSG cut 220 can also be smaller than a width "$w_2$" of the slit structures 216.

By reducing the width "$w_1$" of TSG cut 220 in each memory finger 218, the density of the channel holes 336, and thereby the density of the memory strings and memory cells, can be increased. Furthermore, by incorporating more rows of channel holes 336 between the slit structures 216, a width "d" of the memory finger 218 can be increased and thereby the aspect ratio of a memory finger 218 can be reduced in spite of a large vertical stack of memory cells. As such, the memory finger 218 can be more stable structurally with a larger number of stacked WL layers or memory cells.

Figure 5:
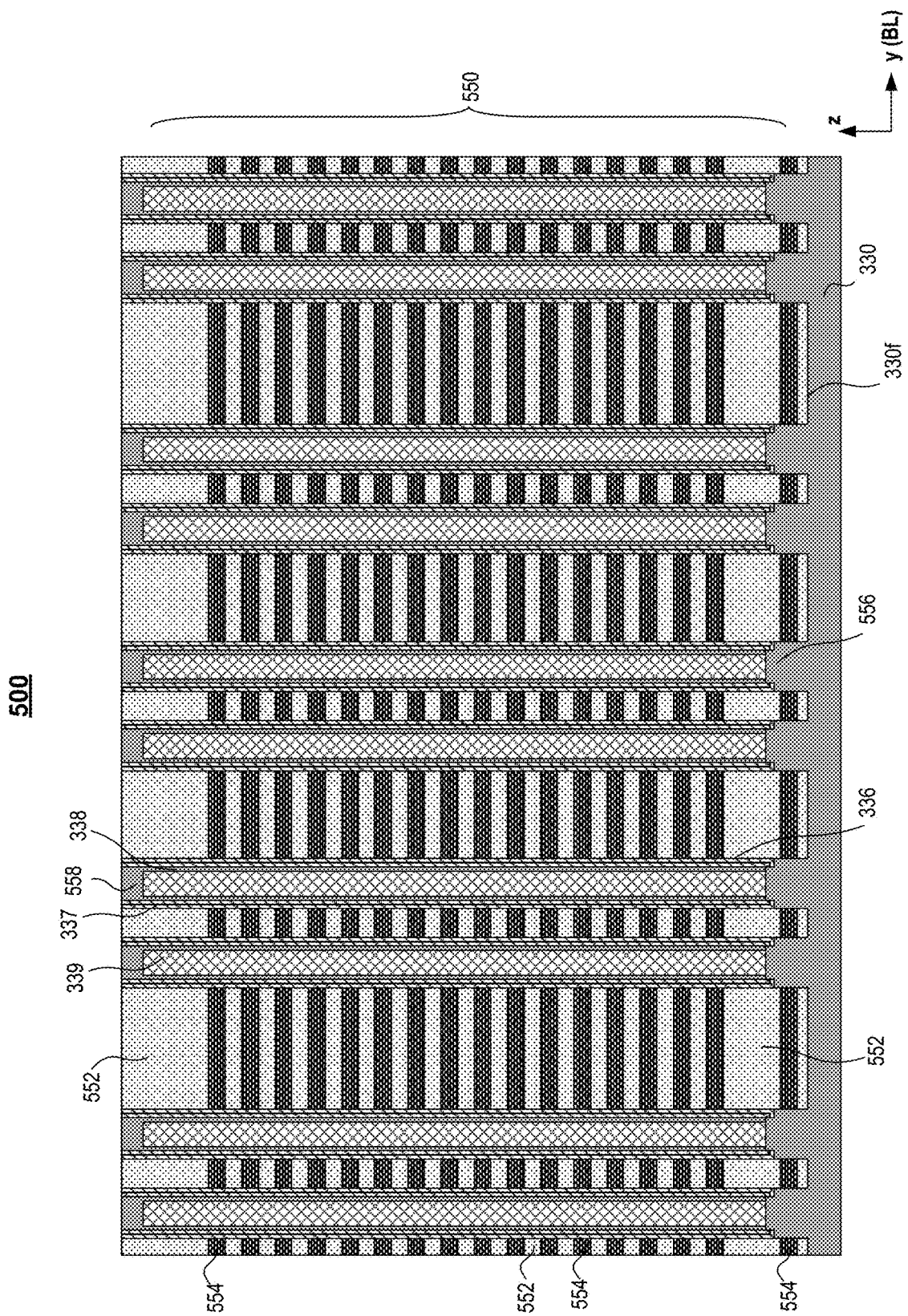
FIGS. 5-9, 10A-10B, and 11 illustrate cross-sectional views of exemplary 3D memory devices at certain fabricating stages, according to some embodiments of the present disclosure.

FIG. 5 illustrates a cross-sectional view of a 3D memory device 500, according to some embodiments of the present disclosure. The cross-sectional view of FIG. 5 is along y-direction (or BL direction) in the top-down view in FIG. 4B. In some embodiments, the 3D memory device 500 can include an alternating dielectric stack 550 disposed on a substrate (e.g., the substrate 330). In some embodiments, the 3D memory device 500 can also include a plurality of channel holes (e.g., the channel holes 336) formed in the alternating dielectric stack 550, penetrating entire film stack and extending into the substrate 330. In some embodiments, the 3D memory device 500 further includes a memory film (e.g., the memory film 337), a channel layer (e.g., the channel layer 338) and a core filling film (e.g., the core filling film 339) disposed inside the channel holes 336.

The substrate 330 can provide a platform for forming subsequent structures. In some embodiments, the substrate 330 can be any suitable semiconductor substrate having any suitable semiconductor materials, such as monocrystalline, polycrystalline or single crystalline semiconductors. For example, the substrate 330 can include silicon, silicon germanium (SiGe), germanium (Ge), silicon on insulator (SOI), germanium on insulator (GOI), gallium arsenide (GaAs), gallium nitride, silicon carbide, III-V compound, or any combinations thereof. In some embodiments, the substrate 330 can include a layer of semiconductor material formed on a handle wafer, for example, glass, plastic, or another semiconductor substrate.

A front surface 330f of the substrate 330 is also referred to as a "main surface" or a "top surface" of the substrate herein. Layers of materials can be disposed on the front surface 330f of the substrate 330. A "topmost" or "upper" layer is a layer farthest or farther away from the front surface 330f of the substrate. A "bottommost" or "lower" layer is a layer closest or closer to the front surface 330f of the substrate.

In addition to the alternating dielectric stack 550, in some embodiments, peripheral devices (not shown) can be formed in the periphery region 105 (see FIG. 1) on the front surface 330f of the substrate 330. In some embodiments, active device areas (not shown) can also be formed in the memory blocks 103 (see FIG. 1) on the front surface 330f of the substrate 330. In some embodiments, the substrate 330 can further include an insulating film 331 on the front surface 330f (not shown in FIG. 5). The insulating film 331 can be made of the same or different material from the alternating dielectric stack 550.

The peripheral devices can include any suitable semiconductor devices, for example, metal oxide semiconductor field effect transistors (MOSFETs), diodes, resistors, capacitors, etc. The peripheral devices can be used in the design of digital, analog and/or mixed signal circuits supporting the storage function of the memory core, for example, row and column decoders, drivers, page buffers, sense amplifiers, timing and controls.

The active device areas in the memory blocks are surrounded by isolation structures, such as shallow trench isolation. Doped regions, such as p-type doped and/or n-type doped wells, can be formed in the active device area according to the functionality of the array devices in the memory blocks.

Referring to FIG. 5, in some embodiments, the alternating dielectric stack 550 includes a plurality of dielectric layer pairs alternatingly stacked on top of each other, wherein the dielectric layer pairs includes a first dielectric layer 552 (also referred to as "dielectric layer") and a second dielectric layer 554 (also referred to as "sacrificial layer") that is different from the first dielectric layer 552. The alternating dielectric stack 550 extends in a lateral direction that is parallel to the front surface 330f of the substrate 330.

In some embodiments, the first dielectric layer 552 can be configured to be the bottommost and the topmost layers of the alternating dielectric stack 550. In this configuration, each second dielectric layer 554 can be sandwiched between two first dielectric layers 552, and each first dielectric layer 552 can be sandwiched between two second dielectric layers 554 (except the bottommost and the topmost layer).

The formation of the alternating dielectric stack 550 can include disposing the first dielectric layers 552 to each have the same thickness or to have different thicknesses. Example thicknesses of the first dielectric layers 552 can range from 10 nm to 500 nm. Similarly, the second dielectric layer 554 can each have the same thickness or have different thicknesses. Example thicknesses of the second dielectric layer 554 can range from 10 nm to 500 nm. It should be understood that the number of dielectric layer pairs in FIG. 5 is for illustrative purposes only and that any suitable number of layers may be included in the alternating dielectric stack 550.

In some embodiments, the alternating dielectric stack 550 can include layers in addition to the first dielectric layer 552 and the second dielectric layer 554, and can be made of different materials and with different thicknesses.

In some embodiments, the first dielectric layer 552 includes any suitable insulating materials, for example, silicon oxide, silicon oxynitride, silicon nitride, TEOS or silicon oxide with F-, C-, N-, and/or H-incorporation. The first dielectric layer 552 can also include high-k dielectric materials, for example, hafnium oxide, zirconium oxide, aluminum oxide, tantalum oxide, or lanthanum oxide films. In some embodiments, the first dielectric layer 552 can be any combination of the above materials.

The formation of the first dielectric layer 552 on the substrate 330 can include any suitable deposition methods such as, chemical vapor deposition (CVD), physical vapor deposition (PVD), plasma-enhanced CVD (PECVD), rapid thermal chemical vapor deposition (RTCVD), low pressure chemical vapor deposition (LPCVD), sputtering, metal-organic chemical vapor deposition (MOCVD), atomic layer deposition (ALD), high-density-plasma CVD (HDP-CVD), thermal oxidation, nitridation, any other suitable deposition method, and/or combinations thereof.

In some embodiments, the second dielectric layer 554 includes any suitable material that is different from the first dielectric layer 552 and can be removed selectively with respect to the first dielectric layer 552. For example, the second dielectric layer 554 can include silicon oxide, silicon oxynitride, silicon nitride, TEOS, poly-crystalline silicon, poly-crystalline germanium, poly-crystalline germanium-silicon, and any combinations thereof. In some embodiments, the second dielectric layer 554 also includes amorphous semiconductor materials, such as amorphous silicon or amorphous germanium. The second dielectric layer 554 can be disposed using a similar technique as the first dielectric layer 552, such as CVD, PVD, ALD, thermal oxidation or nitridation, or any combination thereof.

In some embodiments, the first dielectric layer 552 can be silicon oxide and the second dielectric layer 554 can be silicon nitride.

In some embodiments, the channel holes 336 can be form and arranged in a staggered array form. For example, as shown in the top-down view in FIG. 4B, each row of channel holes 336 can be staggered with its neighboring rows of channel holes 336. In some embodiments, forming of the channel holes 336 includes processes such as photolithography and etching. In some embodiments, a carbon-based polymer material or a hard mask can be used in addition to photoresist for the etching process. The hard mask can include silicon oxide, silicon nitride, TEOS, silicon-containing anti-reflective coating (SiARC), amorphous silicon, or polycrystalline silicon, or any combination thereof. The etching process to form the channel holes 336 can include a dry etching, a wet etching, or a combination thereof. In some embodiments, the alternating dielectric stack 550 can be etched using an anisotropic etching such as a reactive ion etch (ME). In some embodiments, fluorine or chlorine based gases such as carbon-fluorine ($CF_4$), hexafluoroethane ($C_2F_6$), $CHF_3$, $C_3F_6$, $Cl_2$, $BCl_3$, etc., or any combination thereof. The methods and etchants to etch the first and second dielectric layers 552/554 should not be limited by the embodiments of the present disclosure.

In some embodiments, the channel layer 338 includes silicon, such as amorphous silicon, polysilicon, or single crystalline silicon. In some embodiments, the memory film 337 can be a composite layer including a tunneling layer, a storage layer (also known as "charge trap/storage layer"), and a blocking layer. Each channel hole 336 can have a cylinder shape (e.g., a pillar shape). The channel layer 338, the tunneling layer, the storage layer, and the blocking layer are arranged along a direction from the center toward the outer surface of the pillar in the above order, according to some embodiments. The tunneling layer can include silicon oxide, silicon nitride, or any combination thereof. The blocking layer can include silicon oxide, silicon nitride, high dielectric constant (high-k) dielectrics, or any combination thereof. The storage layer can include silicon nitride, silicon oxynitride, silicon, or any combination thereof. In some embodiments, the memory film 337 includes ONO dielectrics (e.g., a tunneling layer including silicon oxide, a storage layer including silicon nitride, and a blocking layer including silicon oxide).

In some embodiments, the core filling film 339 can be disposed to fill each channel hole 336. In some embodiments, the middle of the core filling film 339 can include one or more airgaps. The core filling film 339 can be any suitable insulator, for example, silicon oxide, silicon nitride, silicon oxynitride, spin-on-glass, boron or phosphorus doped silicon oxide, carbon-doped oxide (CDO or SiOC or SiOC:H), fluorine doped oxide (SiOF), or any combination thereof. The core filling film 339 can be deposited inside each channel hole 336 by using, for example, atomic layer deposition (ALD), chemical vapor deposition (CVD), physical vapor deposition (PVD), spin-coating, sputtering, or any other suitable film deposition techniques. The core filling film 339 can also be formed by using repeated deposition and etch-back processes. The etch-back process can include, but not limited to, a wet etching, a dry etching, or a combination thereof.

In some embodiments, the 3D memory array 500 further includes an epitaxial layer 556 connecting to a lower end of the channel layer 338. The epitaxial layer 556 can include any suitable semiconductor material, such as silicon, silicon germanium, germanium, gallium arsenide, gallium nitride, III-V compound, or any combination thereof. The epitaxial layer 556 can be epitaxially grown from the substrate 330. In some embodiments, the epitaxial layer 556 can be epitaxially grown from a doped region (not shown in FIG. 5) in the substrate 330. The doped region can be formed by ion implantation using p-type or n-type dopants, for example boron, phosphorus, arsenic, or any combination thereof. In some embodiments, the epitaxial layer 556 can be used as the transistor channel controlled by the lower select gate 332. In some embodiments, the epitaxial layer 556 can be a polycrystalline semiconductor material, for example, polycrystalline silicon.

Referring still to FIG. 5, a top channel structure 558 can be formed on top of the core filling film 339 in the channel holes 336, according to some embodiments of the present disclosure. The top channel structure 558 can be connected to the channel layer 338 in the channel hole 336. In some embodiments, the top channel structure 558 can be any suitable semiconductor, for example, amorphous silicon, polycrystalline silicon or crystalline silicon. The top channel structure 558 can be formed by using a thin film deposition process, such as a chemical vapor deposition (CVD) process (e.g., PECVD, LPCVD, RTCVD, MOCVD), Atomic Layer Deposition (ALD), sputtering, or any other suitable processes.

As shown in FIG. 5, the 3D memory device 500 can have a planar top surface, according to some embodiments of the present disclosure. By using a planarization process, such as chemical mechanical polishing (CMP), the top channel structure 558, the memory film 337, the channel layer 338 can be coplanar with the alternating dielectric stack 550.

Figure 6:
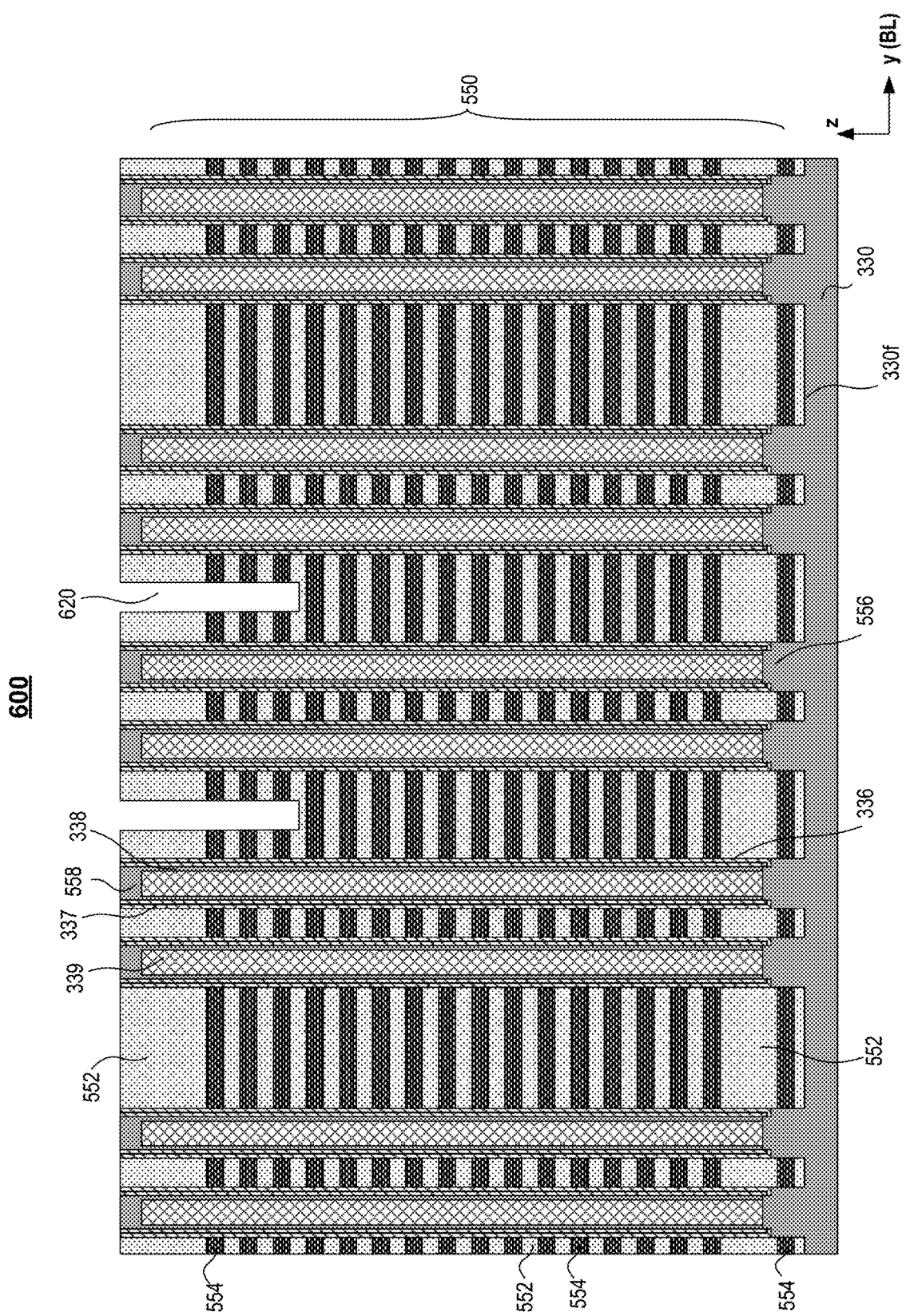

FIG. 6 illustrates a cross-sectional view of an exemplary 3D memory device 600, according to some embodiments of the present disclosure. The cross-section is along y-direction (or BL direction) in the top-down view in FIG. 4B. The 3D memory device 600 includes multiple top select gate (TSG) openings 620, formed in an upper portion of the alternating dielectric stack 550 of the 3D memory device 500 (as in FIG. 5). In the subsequent processes, the TSG openings 620 can form the TSG cuts 220 shown in FIG. 4B.

As shown in FIG. 6, the TSG openings 620 can penetrate top three dielectric layer pairs of the alternating dielectric stack 550 and stop at the fourth dielectric layer pair (counted from the top). More specifically, the TSG openings 620 can land on the first dielectric layer 552 of the fourth dielectric layer pair in the alternating dielectric stack 550. In some embodiments, the TSG openings 620 can extend into the first dielectric layer 552 of the fourth dielectric layer pair. It is noted that the TSG openings 620 can penetrate any suitable number of top dielectric layer pairs of the alternating dielectric stack 550. In some embodiments, the TSG openings 620 can be formed by dry etching, wet etching, or a combination thereof. It is noted that "top" or "upper" as used herein means farther way from the substrate 330, while "bottom" and "lower" means closer to the substrate 330.

In some embodiments, the TSG openings 620 can extend along x-direction (or WL direction), perpendicular to the cross-section in FIG. 6. The top-down view of an exemplary design of the TSG openings 620 correspond to the TSG cuts 220 shown in FIG. 4B.

Figure 7:
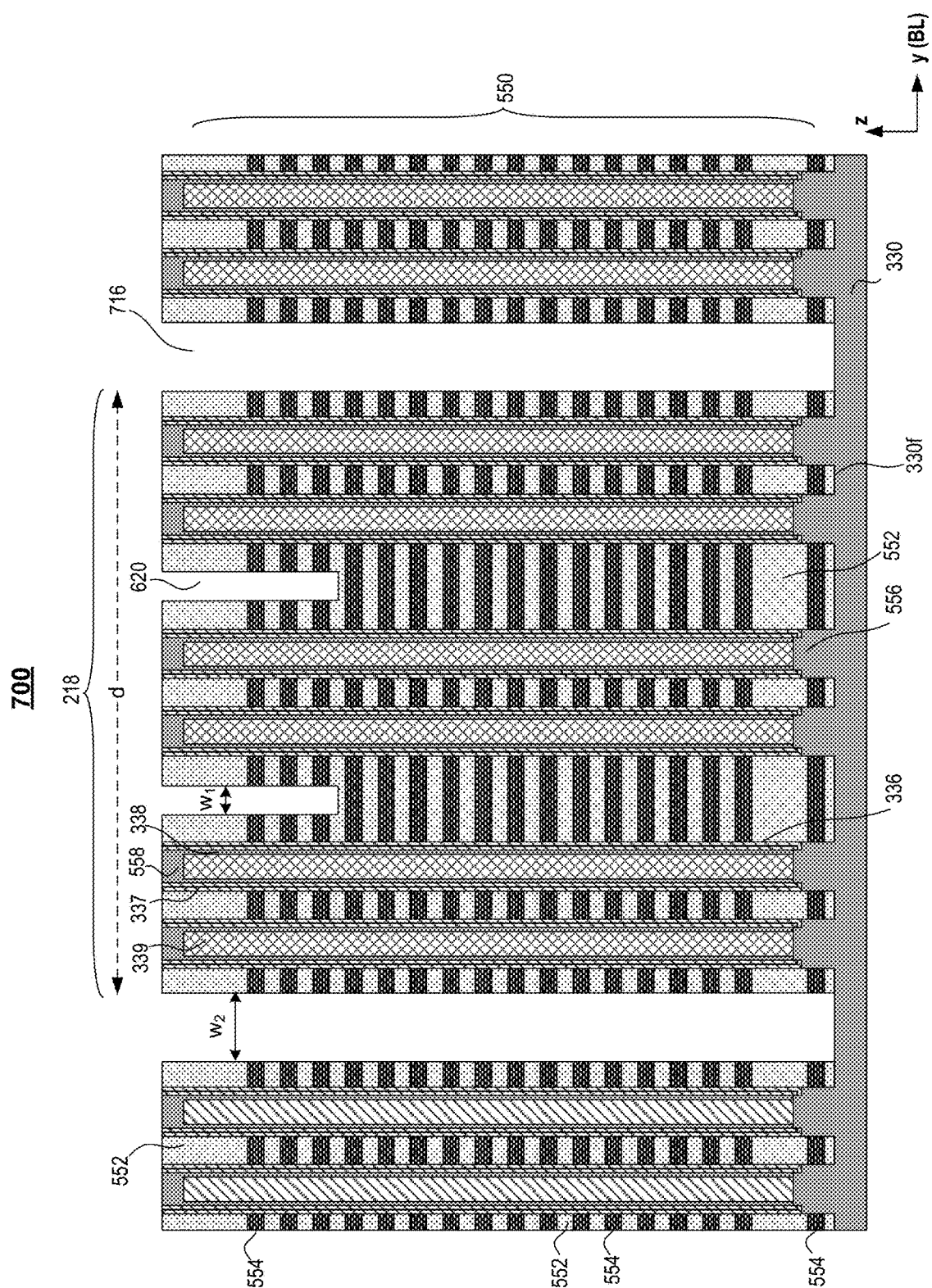

FIG. 7 illustrates a cross-sectional view of an exemplary 3D memory device 700, according to some embodiments of the present disclosure. The cross-section is along y-direction (or BL direction) in the top-down view in FIG. 4B. The 3D memory device 700 includes multiple slit openings 716 formed in the alternating dielectric stack 550 of the 3D memory device 600 (as in FIG. 6). After the subsequent processes, the slit openings 716 can form the slit structures 216 shown in FIG. 4B.

In some embodiments, the slit openings 716 penetrate vertically through the entire alternating dielectric stack 550 and expose at least a portion of the substrate 330. In some embodiments, the slit openings 716 can have the width $w_2$ larger than the width $w_1$ of the TSG openings 620. The slit openings 716 can be formed by photolithography and a suitable etching process, for example, dry etching, wet etching, or a combination thereof. In one example, the etching process of the slit openings 716 can be similar to the etching process for the channel holes 336 described herein.

In some embodiments, the slit openings 716 can be a rectangular shape extending in parallel to the TSG openings 620 along x-direction (or WL direction), perpendicular to the cross-section in FIG. 7. The potion of the alternating dielectric stack 550 located between the adjacent slit openings 716 is the region corresponding to the memory finger 218 of a 3D NAND memory. As also shown in the top-down view in FIG. 4B, the distance between two adjacent slit openings 716 corresponds to the width "d" of the memory finger 218.

Figure 8:
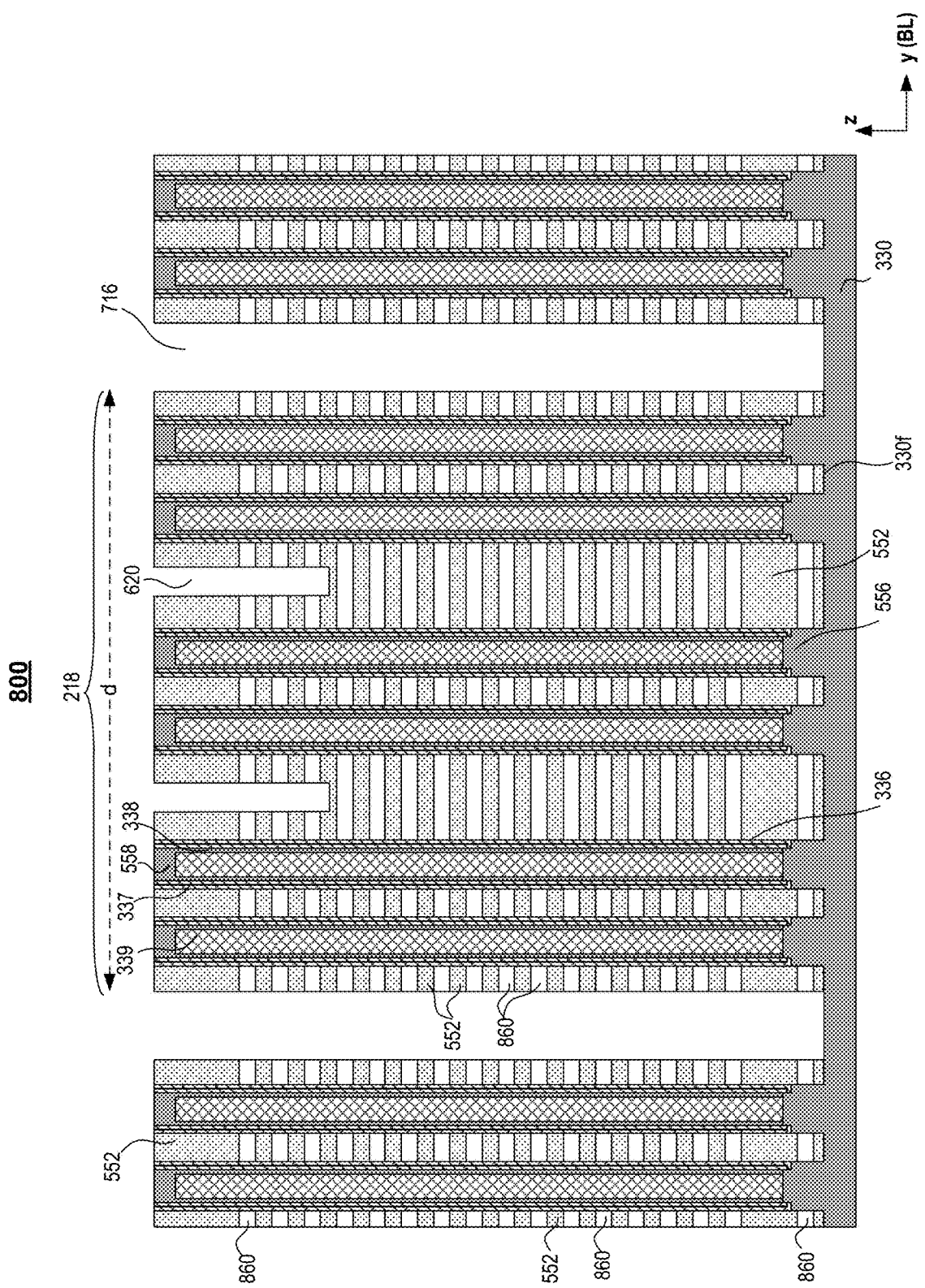

FIG. 8 illustrates a cross-sectional view of a 3D memory device 800, according to some embodiments of the present disclosure. The cross-section is along y-direction (or BL direction) in the top-down view in FIG. 4B. The 3D memory device 800 includes a plurality of lateral tunnels 860, wherein the plurality of lateral tunnels 860 can be formed by removing the second dielectric layers 554 from the alternating dielectric stack 550 of the 3D memory device 700 in FIG. 7. The lateral tunnels can extend in a lateral direction between adjacent first dielectric layers 552. It is noted that, the term "lateral/laterally" used herein means the xy-plane, parallel to the top surface 330f of the substrate 330.

The second dielectric layers 554 in the alternating dielectric stack 550 in FIG. 7 are also referred to as sacrificial layers, and can be removed selectively from between the first dielectric layers 552. In the other words, the etching process of the second dielectric layers 554 can have minimal impact on the first dielectric layers 552. The second dielectric layers 554 can be removed by an isotropic dry etch and/or wet etch. The plasma or chemical used in the dry/wet etch can travel vertically and laterally from the slit openings 716 and the TSG openings 620 (see also top-down view in FIG. 4B). In some embodiments, the second dielectric layer 554 can be silicon nitride. In this example, the second dielectric layer 554 can be removed by RIE using one or more etchants of $CF_4$, $CHF_3$, $C_4F_8$, $C_4F_6$, and $CH_2F_2$, etc. In some embodiments, the second dielectric layer 554 can be removed using wet etch, such as phosphoric acid. After the second dielectric layers 554 are removed, portions of the memory film 337 in the channel holes 336 are exposed laterally in the lateral tunnels 860.

In some embodiments, the distance "d" between adjacent slit openings 716 can be increased to ensure the 3D memory device 800 structurally stable at the formation of the lateral tunnels 860 such that the stacked films will not flip over or collapse. With a given number of word lines or stacked memory cells (e.g., a given number of dielectric layer pairs in the alternating dielectric stack 550), the aspect ratio of the alternating dielectric stack 550 can be reduced by increasing the distance "d" between adjacent slit openings 716 (also referred to as the width "d" of each memory finger 218). In addition, as shown in the top-down view in FIG. 4B, twelve rows of channel holes 336 can be formed in each memory finger 218 (compared with nine rows of channel holes 336 per memory finger 218 in FIG. 4A). In some embodiments, each memory finger 218 can have (M+1)·N number rows of channel holes 336. The 3D memory device 800 can be structurally supported by the channel holes 336 that are filled with the memory film 337, channel layer 338 and core filling film 339. Therefore, by increasing the "d" between adjacent slit openings 716 (i.e., by increasing the width "d" of each memory finger 218), the number of channel holes 336 in each memory finger 218 can also be increased. With more support from the filled channel holes as well as reduced aspect ratio, the 3D memory device 800 can be structurally more robust.

Figure 9:
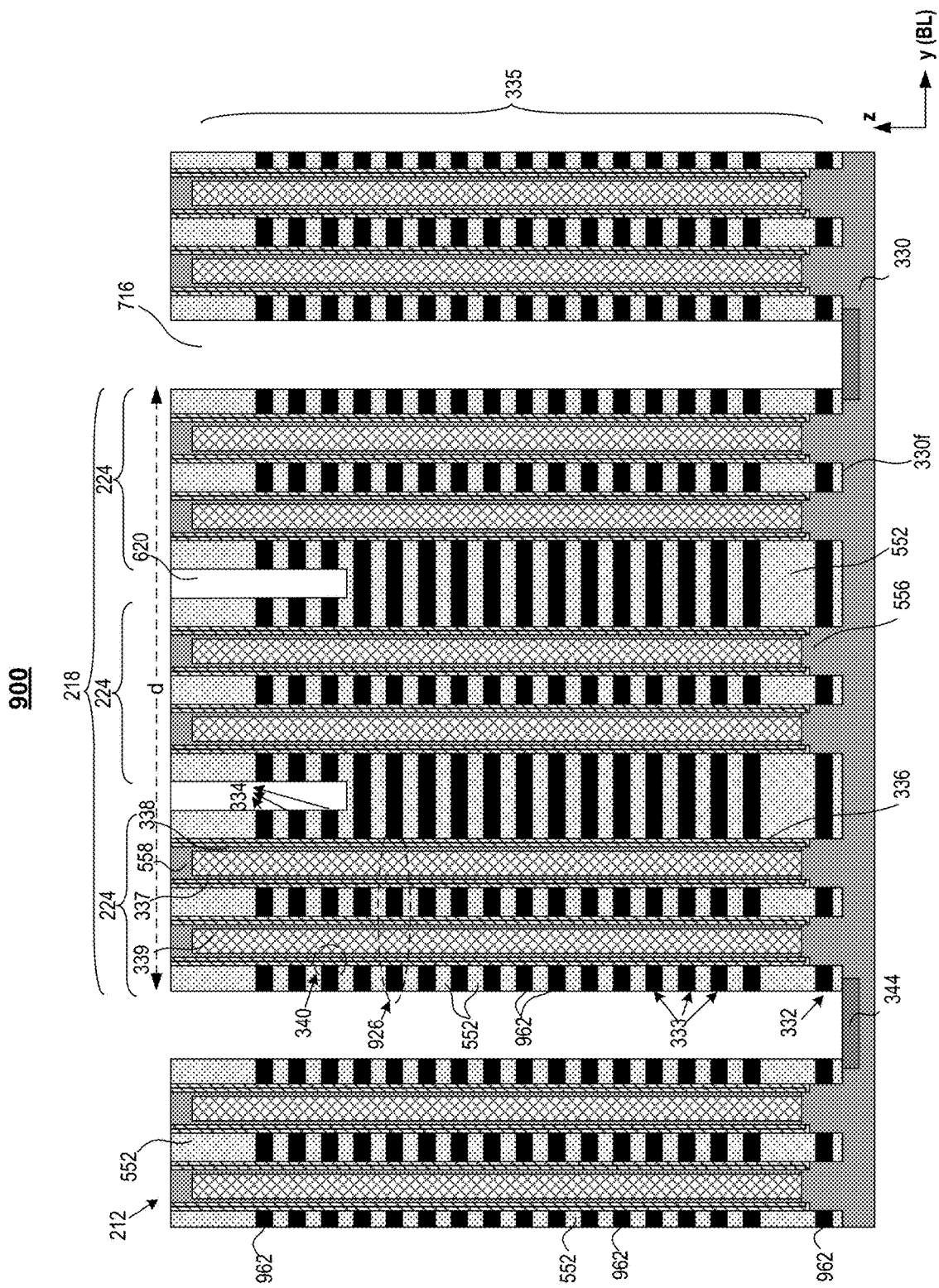

FIG. 9 illustrates a cross-sectional view of an exemplary 3D memory device 900, according to some embodiments of the present disclosure. The cross-section is along y-direction (or BL direction) in the top-down view in FIG. 4B. The 3D memory device 900 includes a plurality of conductive layers 962, located in between adjacent first dielectric layers 552, wherein the conductive layers 962 and the first dielectric layers 552 form a film stack of alternating conductive and dielectric layers (e.g., the film stack 335 shown in FIG. 3).

In some embodiments, the conductive layer 962 can be formed by filling the lateral tunnels with a suitable conductive material. The conductive material for the conductive layer 962 can include metal or metal alloys such as tungsten (W), aluminum (Al), titanium (Ti), copper (Cu), cobalt (Co), nickel (Ni), titanium nitride (TiN), tungsten nitride (WN), tantalum (Ta), tantalum nitride (TaN), AlTi, or any combination thereof.

In some embodiments, the conductive material for the conductive layer 962 can also include poly-crystalline semiconductors, such as poly-crystalline silicon, poly-crystalline germanium, poly-crystalline germanium-silicon and any other suitable material, and/or combinations thereof. In some embodiments, the poly-crystalline material can be incorporated with any suitable types of dopant, such as boron, phosphorous, arsenic, or any combination thereof. In some embodiments, the conductive layer 962 can also be amorphous semiconductors such as amorphous silicon.

In some embodiments, the conductive material can fill the horizontal tunnel 970 using a suitable deposition method such as chemical vapor deposition (CVD) (e.g., LPCVD, PECVD, MOCVD, RTCVD, etc.), physical vapor deposition (PVD), sputtering, evaporation, atomic layer deposition (ALD), or any combination thereof. In some embodiments, the conductive layers 962 include tungsten (W) deposited by CVD.

In some embodiments, the conductive layer 962 can also be made from a metal silicide, including $WSi_x$, $CoSi_x$, $NiSi_x$, $TiSi_x$, or $AlSi_x$, etc. The forming of the metal silicide material can include forming a metal layer and a poly-crystalline semiconductor using similar techniques described above. The forming of metal silicide can further include applying a thermal annealing process on the deposited metal layer and the poly-crystalline semiconductor layer, followed by removal of unreacted metal.

In some embodiments, etching and cleaning processes are used to remove excess conductive materials on sidewalls of the slit openings 716. As such, each conductive layer 962 can be electrically isolated from each other.

In some embodiments, a gate dielectric layer (not shown) can be disposed in the lateral tunnels 860 in FIG. 8 prior to the formation of the conductive layer 962. The gate dielectric layer can cover exposed surfaces of the first dielectric layer 552 and exposed surface of the memory film 337 after removing the second dielectric layers 554. The gate dielectric layer can be used to reduce leakage current between adjacent word lines (gate electrodes) and/or to reduce leakage current between the conductive layer 962 (e.g., as a control gate) and a channel of the memory cell. In some embodiments, the gate dielectric layer can function as a gate dielectric for a MOSFET, e.g., at the intersection between the lower select gate 332 and the epitaxial layer 556. The gate dielectric layer can include any suitable insulator, for example, silicon oxide, silicon nitride, silicon oxynitride, and/or any suitable combinations thereof. The gate dielectric layer can also include high-k dielectric materials, such as hafnium oxide, zirconium oxide, aluminum oxide, tantalum oxide, lanthanum oxide, and/or any combination thereof. The gate dielectric layer can be disposed by one or more suitable deposition processes, such as CVD, PVD, and/or ALD.

It is noted that the number of memory strings 212 and memory cells 340 are shown for illustrative purposes in FIG. 9, and can be increased for higher storage capacity. The number of conductive layers 962 serving as top select gates 334 can also be any other number and is not limited to the example in FIG. 9.

In some embodiments, the doped source line regions 344 can be formed in an exposed portion of the substrate 330 by using techniques such as ion implantation.

In some embodiments, the conductive layers 962 can be electrically connected to a lower select gate (e.g., the lower select gate 332 in FIG. 3), a plurality of control gates or word lines (e.g., the control gates or word lines 333 in FIG. 3) or a top select gate (e.g., the top select gate 334 in FIG. 3). In FIG. 9, three upper conductive layers 962 can form three top select gates (TSG) 334, and the bottom conductive layer 962 can form the lower select gate (LSG) 332. The remaining conductive layers 962 can be electrically connected to the control gates or word lines 333.

In some embodiments, the intersection between the LSG 332 and the epitaxial layer 556 (a gate dielectric is not shown in FIG. 9) forms a lower select transistor. The intersection between the top TSG 334, the memory film 337 and the channel layer 338 forms a top select transistor.

In some embodiments, the conductive layer 962 can function as a control gate (e.g., the control gate 333), wherein the intersection between the control gate 333, the memory film 337 and the channel layer 338 forms a memory cell (e.g., the memory cell 340 in FIG. 3). The multiple stacked memory cells 340 along the sidewall of the same channel hole 336 forms a memory string (e.g., the memory string 212 in FIGS. 2 and 3).

In some embodiments, the slit openings 716 can divide a memory block into multiple memory fingers (e.g., the memory fingers 218 in FIGS. 2, 4A and 4B). The TSG openings 620 can further divide the memory finger 218 into two or more memory slices (e.g., the memory slices 224 in FIGS. 2, 4A and 4B). It is noted that the cross-sectional view of the 3D memory device 900 in FIG. 9 is in the yz-plane. The memory fingers 218 and the memory slices 224 extend in x-direction, perpendicular to the cross-section. A top-down view of an exemplary design is shown in FIG. 4B.

In the example shown in FIG. 9, the two TSG openings 620 separate the memory finger 218 into three memory slices 224 (also shown in top-down view in FIG. 4B). In this example, each memory slice 224 can be selectively programed by using the three top select gates 334.

In some embodiments, the channel layer 338 of the memory string 212 can be connected to a bit line (e.g., the bit line 341 in FIG. 3) from the top channel structure 558. The channel layer 338 can also be connected to a common source contact (also referred to as an array common source) from the doped source line region 344 in the substrate 330.

In each memory slice 244, the memory cells 340 addressed by the same control gates 333 (or the same conductive layer 962) form a memory page 926, wherein each memory page 926 can be programed (e.g., read and write) independently. It is noted that although the cross-sectional view of FIG. 9 shows only two memory strings 212 in each memory slice 224, the actual number of memory strings 212 in each memory slice 224 is not so limiting (see the top-down view in FIG. 4B). Similarly, the number of memory cells 340 in each memory page 926 is also not limited to that shown in FIG. 9.

Figure 10A:
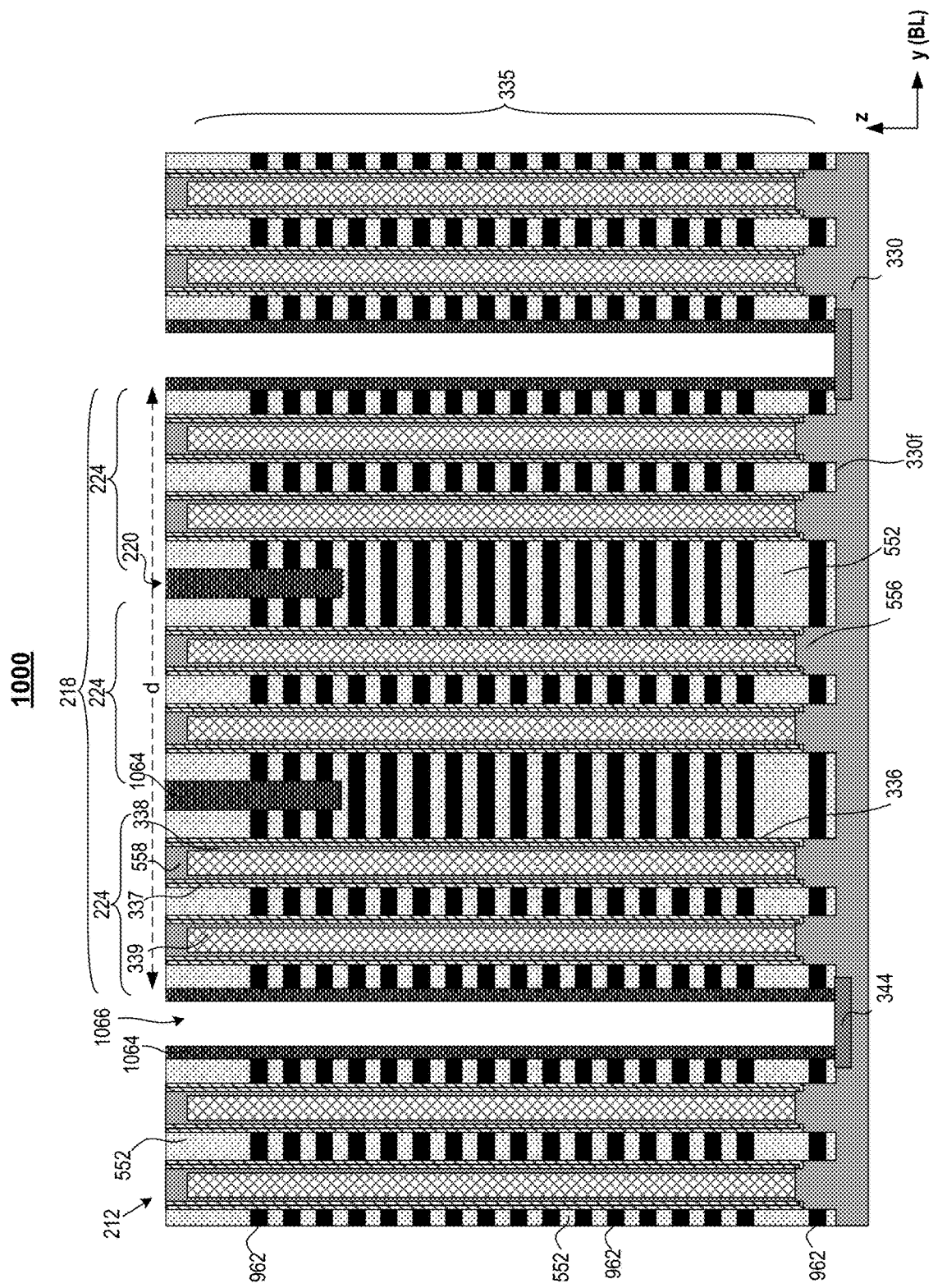

FIG. 10A illustrates a cross-sectional view of a 3D memory device 1000, according to some embodiments of the present disclosure. The cross-section is along y-direction (or BL direction) in the top-down view in FIG. 4B. The 3D memory device 1000 includes an insulating film 1064 disposed on the sidewalls of the slit openings 716 and the TSG openings 620 of the 3D memory device 900 (in FIG. 9). In some embodiments, the insulating film 1064 can have a thickness larger enough to fill up the TSG openings 620 and form the TSG cuts 220. Because the width $w_2$ of the slit opening 716 can be larger than the width $w_1$ of the TSG opening 620 (see FIG. 7), the thickness of the insulating film 1064 can be selected so that the insulating film 1064 does not fill up the slit opening 716, but forms a slit trench 1066.

Figure 10B:
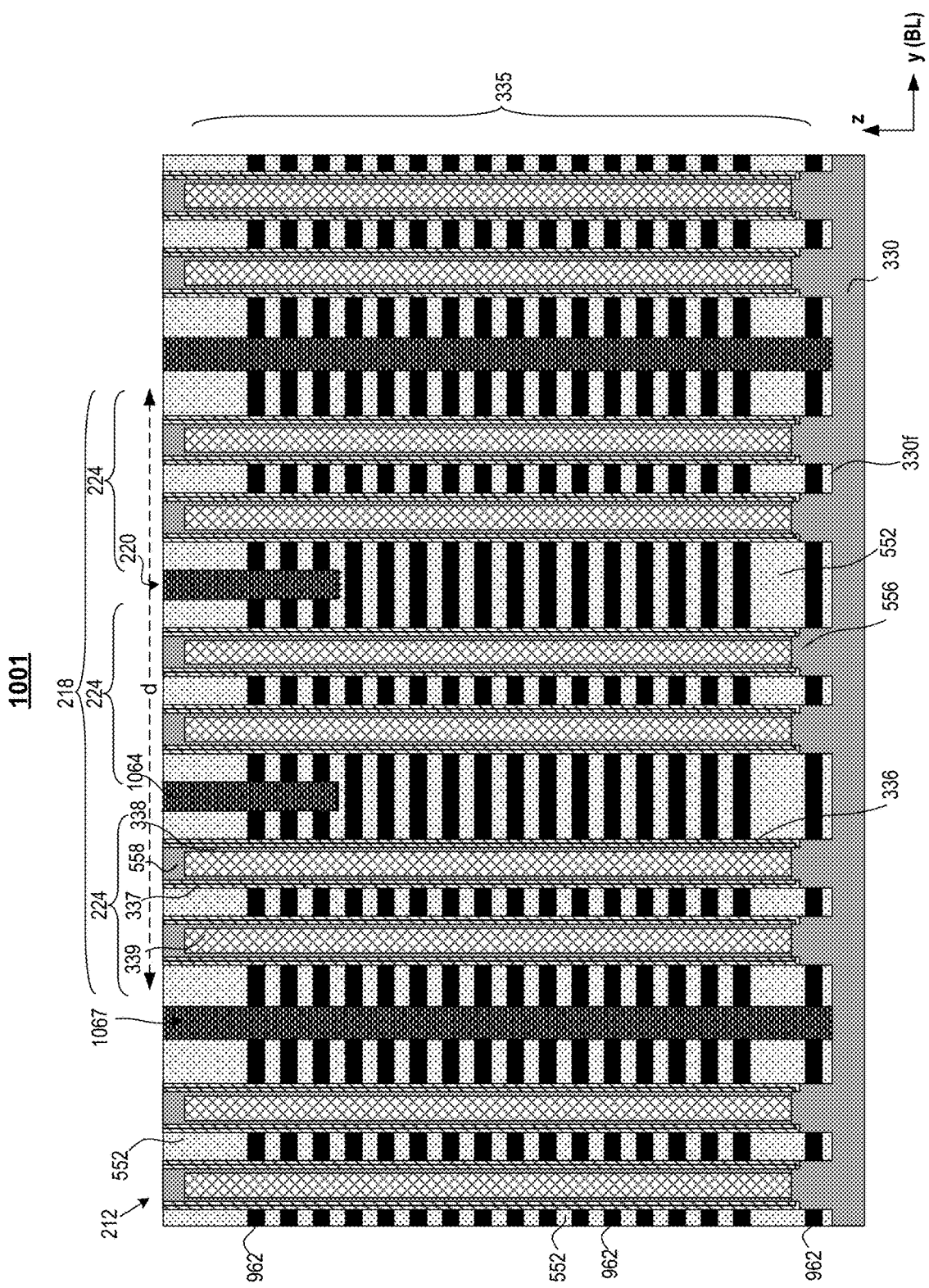

FIG. 10B illustrates a cross-sectional view of a 3D memory device 1001, according to some embodiments of the present disclosure. The cross-section is along y-direction (or BL direction) in the top-down view in FIG. 4B. In this example, the insulating film 1064 also fills up the slit opening 716, forming a gate line slit (GLS) 1067.

In some embodiments, multiple slit openings 716 with different widths can be formed simultaneously for the 3D memory device 700 (in FIG. 7) such that slit trenches 1066 (as shown in FIG. 10A), GLS 1067 (as shown in FIG. 10B) and TSG cuts 220 can be formed simultaneously by disposing the insulating film 1064.

Referring to FIG. 10A, in some embodiments, the insulating film 1064 can be any suitable insulator, for example, silicon oxide, silicon nitride, silicon oxynitride, boron or phosphorus doped silicon oxide, carbon-doped oxide (CDO or SiOC or SiOC:H), or fluorine doped oxide (SiOF), or any combination thereof. The insulating film 1064 can be deposited by using, for example, ALD, CVD (e.g., PECVD, RTCVD, LPCVD, etc.), PVD, sputtering, evaporating, or any other suitable film deposition techniques.

In some embodiments, an anisotropic etching process (e.g., ME) can be performed to remove the insulating film 1064 from the bottom of the slit trench 1066 and expose at least a portion of the substrate 330 or the doped source line region 344. The insulating film 1064 on the top of the film stack 335 of alternating conductive and dielectric layers can also be removed simultaneously during the anisotropic etching process. In the other words, the insulating film 1064 can be formed as a spacer on a sidewall of the slit opening 716.

Figure 11:
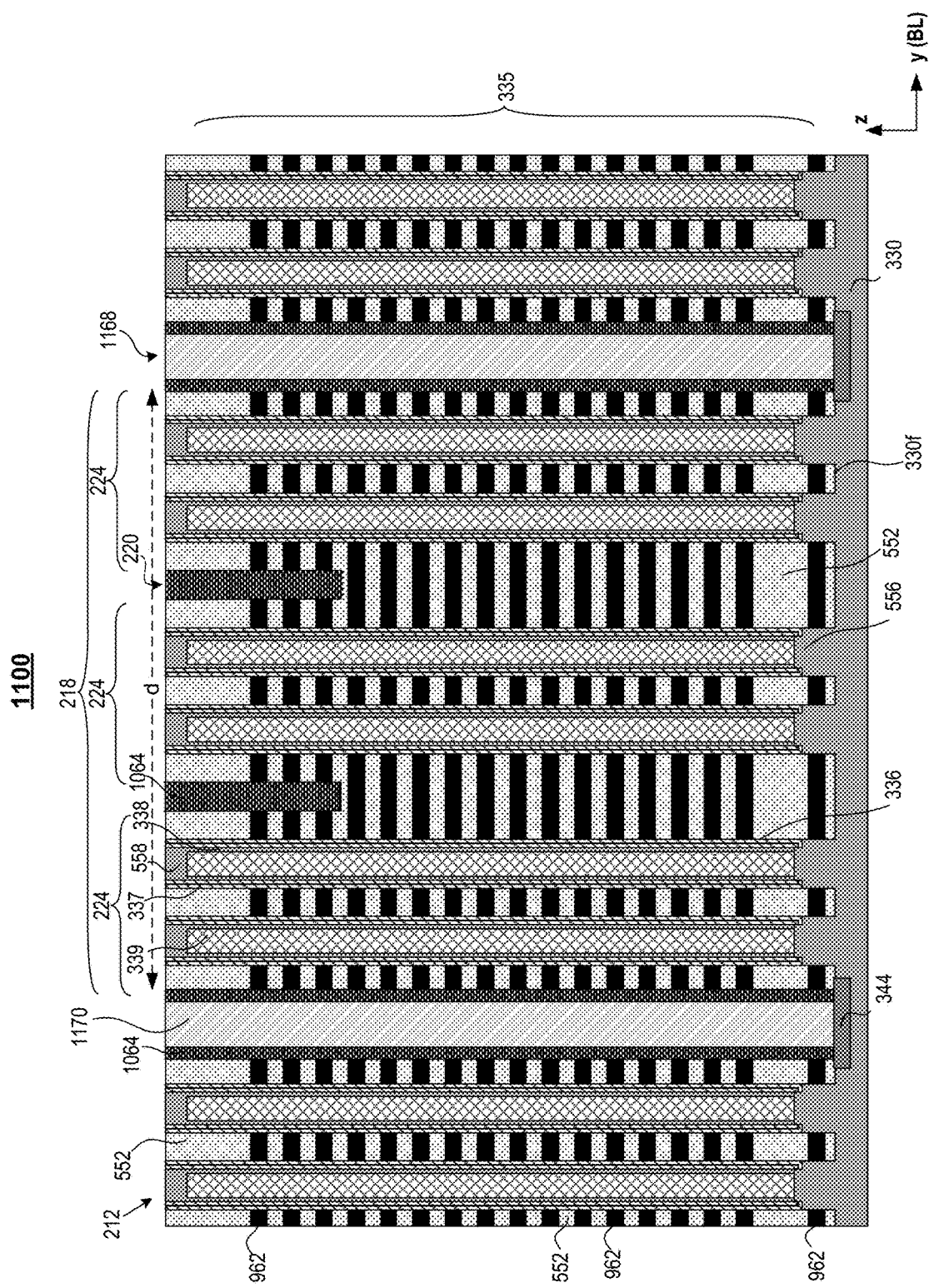

FIG. 11 illustrates a cross-sectional view of a 3D memory device 1100, according to some embodiments of the present disclosure. The cross-section is along y-direction (or BL direction) in the top-down view in FIG. 4B. The 3D memory device 1100 includes an array common source (ACS) 1168 (also referred to as the common source contact). The ACS 1168 can be formed by disposing a conductive core 1170 inside the slit trench 1066 of the 3D memory device 1000 (in FIG. 10A).

In some embodiments, the conductive core 1170 can include metal or metal alloys such as tungsten (W), aluminum (Al), titanium (Ti), copper (Cu), cobalt (Co), nickel (Ni), titanium nitride (TiN), tungsten nitride (WN), tantalum (Ta), tantalum nitride (TaN), AlTi, or any combination thereof.

In some embodiments, the conductive core 1170 can also include poly-crystalline semiconductors, such as poly-crystalline silicon, poly-crystalline germanium, poly-crystalline germanium-silicon and any other suitable material, and/or combinations thereof. In some embodiments, the poly-crystalline material can be incorporated with any suitable types of dopant, such as boron, phosphorous, arsenic, or any combination thereof. In some embodiments, the conductive core 1170 can also include amorphous semiconductors such as amorphous silicon.

In some embodiments, the conductive core 1170 can also include metal silicide, such as $WSi_x$, $CoSi_x$, $NiSi_x$, $TiSix$, or $AlSi_x$, etc.

In some embodiments, the conductive core 1170 can include any combination of the conductive material aforementioned.

In some embodiments, the conductive core 1170 can be disposed using any suitable deposition method such as CVD (e.g., LPCVD, RTCVD, PECVD, etc.), PVD, ALD, sputtering, evaporation, plating, or any combination thereof. In some embodiments, the conductive core 1170 includes tungsten (W) deposited by CVD.

In some embodiments, the 3D memory device 1100 can have a planar top surface by using a planarization process after disposing the conductive core 1170. Any excess material of the conductive core 1170 outside the slit trenches 1066 (e.g., on top of the TSG cuts 220, on top of the memory strings 212 and on top of the film stack 335 of alternating conductive and dielectric layers) can be removed by the planarization process. The planarization process can include chemical mechanical polishing.

As described previously, in some embodiments, slit openings 716 with different widths can be formed simultaneously for the 3D memory device 700 (in FIG. 7). In this example, slit structures (e.g., the slit structures 216 in FIGS. 2, 4A and 4B) can include GLS 1067 and ACS 1168, depending on the width of the corresponding slit opening 716. As such, the 3D memory device 1100 can include the ACS 1168 (as shown in FIG. 11) formed in some of the slit openings 716 and the GLS 1067 (shown in FIG. 10B) formed in some other slit openings 716.

Figure 12:
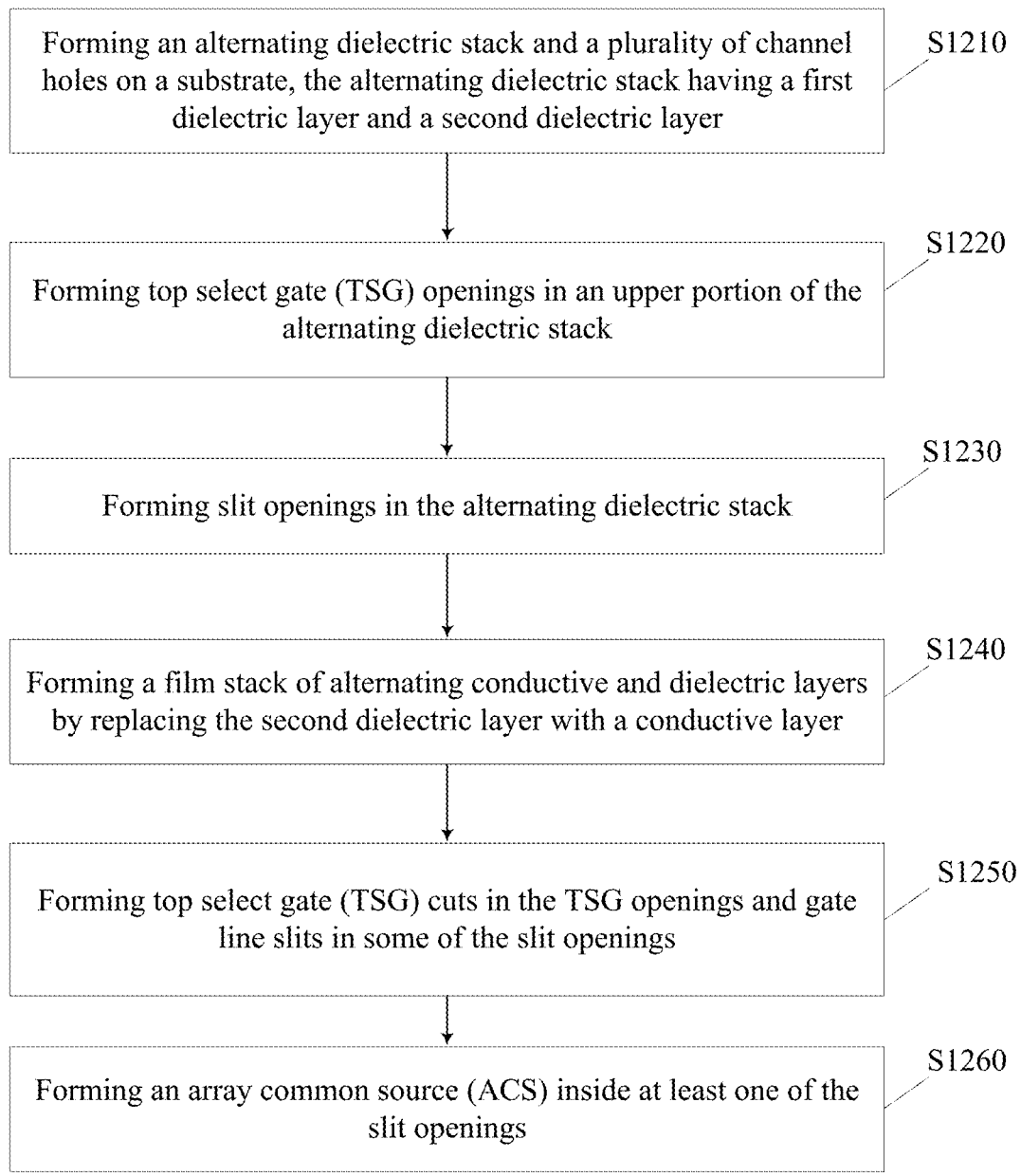
FIG. 12 illustrates a flow diagram of an exemplary method for forming a 3D memory device in accordance with some embodiments of the present disclosure.

FIG. 12 illustrates an exemplary fabrication process 1200 for forming 3D memory devices shown in FIGS. 4B, 5-9, 10A-10B and 11, accordance to some embodiments of the present disclosure. It should be understood that the operations shown in fabrication process 1200 are not exhaustive and that other operations can be performed as well before, after, or between any of the illustrated operations. In some embodiments, some process steps of exemplary fabrication process 1200 can be omitted or include other process steps that are not described here for simplicity. In some embodiments, process steps of fabrication process 1200 can be performed in a different order and/or vary.

As shown in FIG. 12, fabrication process 1200 starts at process step S1210, in which an alternating dielectric stack (e.g., the alternating dielectric stack 550 in FIG. 5) and a plurality of channel holes (e.g., the channel holes 336 in FIG. 5) can be formed on a substrate 330, the alternating dielectric stack having a first dielectric layer (e.g., the first dielectric layer 552 in FIG. 5) and a second dielectric layer (e.g., the second dielectric layer 554 in FIG. 5).

In some embodiments, the first dielectric layer 552 and the second dielectric layer 554 can include any suitable insulator, where the second dielectric layer 554 is different from the first dielectric layer 552. In some embodiments, the first dielectric layer 552 can be silicon oxide and the second dielectric layer 554 can be silicon nitride. The alternating dielectric stack 550 can be formed by one or more thin film deposition processes such as CVD, PVD, ALD, sputtering, or any combination thereof.

In some embodiments, after disposing the alternating dielectric stack 550 on the substrate 330, a staircase structure can be formed at an end of the alternating dielectric stack 550 by using multiple etch-trim processes.

In some embodiments, the plurality of channel holes 336 can be formed, penetrating the entire alternating dielectric stack 550 and exposing at least a portion of the substrate 330. The forming of the channel holes 336 can include processes such as photolithography and etching, for example, anisotropic reactive ion etching (RIE). In some embodiments, a subsequent wet process can be used to clean the channel holes 336 to remove possible polymer or by-products from the RIE process.

In some embodiments, an epitaxial layer (e.g., the epitaxial layer 556 in FIG. 5) can be deposited inside the channel holes 336 to form an epitaxial plug. In this example, the epitaxial layer 556 can be deposited by using selective epitaxy, where a semiconductor layer (for example silicon) can only grow from (or be deposited on) the exposed portion of the substrate 330, not on any dielectric film (e.g., the first and second dielectric layers 552/554). In some embodiments, the epitaxial layer 556 can be doped by in-situ doping during epitaxy or by subsequent ion-implantation.

In some embodiments, a memory film (e.g., the memory film 337), a channel layer (e.g., the channel layer 338) and a core filling film (e.g., the core filling film 339) can be disposed sequentially inside the channel holes 336, as shown in FIG. 5. In some embodiments, the memory film 337 includes ONO dielectrics (e.g., a tunneling layer including silicon oxide, a storage layer including silicon nitride, and a blocking layer including silicon oxide). In some embodiments, the memory film 337 can also include high-k dielectrics. In some embodiments, the channel layer 338 can be an amorphous silicon layer or a polycrystalline silicon layer formed by using a thin film deposition process, such as a CVD, PVD, ALD, etc.

In some embodiments, a planarization process (e.g., chemical mechanical polishing) can be used to remove excess memory film 337, channel layer 338 and core filling film 339 outside the channel holes 336 to form a planarized top surface.

In some embodiments, the core filling film 339 can be further recessed by an etching process (e.g., RIE) to form a "dip" inside the channel hole 336, followed by a thin film deposition of a semiconductor material (e.g., amorphous or polycrystalline silicon) to form a top channel structure (e.g., the top channel structure 558 in FIG. 5). The top channel structure 558 is connected to the channel layer 338 and can function as a contact pad for the channel layer 338. Another planarization process (e.g., chemical mechanical polishing) can be used to remove the semiconductor material outside the channel holes 336 to form a planarized top surface.

At process step S1220, top select gate (TSG) openings (e.g., the TSG openings 620 in FIG. 6) can be formed in an upper portion of the alternating dielectric stack 550. The TSG openings 620 can be formed by using processes such as photolithography and etching (e.g., RIE). In some embodiments, the TSG openings 620 vertically penetrate three pairs of the first and second dielectric layers 552/554 located at the top portion of the alternating dielectric stack 550. However, the number of the first and second dielectric layers 552/554, into which the TSG openings 620 extend, is not limited and can be any other suitable number optimized for a 3D memory device. It is noted that "upper" or "top" used herein means further away from the substrate 330, while "lower" or "bottom" means closer to the substrate 330.

At process step S1230, slit openings (e.g., the slit openings 716 in FIG. 7) can be formed in the alternating dielectric stack 550. The slit openings 716 penetrate through the entire alternating dielectric stack 550 and expose at least a portion of the substrate 330. The slit openings 716 can be formed by using photolithography and etching (e.g., RIE).

In some embodiments, the slit openings 716 can divide a memory block into a plurality of memory fingers (e.g., the memory fingers 218 in FIGS. 2, 4A, 4B and 7). In some embodiments, the slit openings 716 can have a width "$w_2$" larger than a width "$w_1$" of the TSG openings 620. In some embodiments, the slit openings 716 can have various widths in the same 3D memory device.

At process step S1240, a film stack of alternating conductive and dielectric layers (e.g., the film stack 335 of alternating conductive and dielectric layers in FIG. 9) can be formed by replacing the second dielectric layer 554 with a conductive layer (e.g., the conductive layer 962 in FIG. 9).

In some embodiments, the second dielectric layers 554 of the alternating dielectric stack 550 can be removed from the alternating dielectric stack 550 by using a selective etching process, wherein the selective etching process can etch the second dielectric layers 554 with a minimum impact on the first dielectric layers 552. In one example, the second dielectric layers 554 include silicon nitride and the first dielectric layers 552 include silicon oxide. In this example, the second dielectric layers 554 can be removed by using hot phosphoric acid ($H_3PO_4$). The wet chemical diffuses through the slit openings 716 and the TSG openings 620 and etches the second dielectric layers 554 horizontally in xy-planes, parallel to a top surface of the substrate 330 (as shown in FIG. 8). After removing the second dielectric layers 554, a plurality of lateral tunnels (e.g., the lateral tunnels 860 in FIG. 8) can be formed. The lateral tunnels 860 are sandwiched between the first dielectric layers 552. After forming the lateral tunnels 860, portions of the memory film 337 in the channel holes 336 can be exposed.

In some embodiments, a gate dielectric layer can be disposed after forming the lateral tunnels 860. The gate dielectric layer can be any suitable dielectric material, for example, silicon oxide, silicon nitride, silicon oxynitride, or any combination thereof. In some embodiments, the gate dielectric layer can also include a high-k dielectric material, such as hafnium oxide, zirconium oxide, aluminum oxide, tantalum oxide, lanthanum oxide, and/or any combination thereof. The gate dielectric layer can be disposed by one or more suitable deposition processes, such as CVD, PVD, ALD, or any combination thereof.

In some embodiments, the conductive layer 962 (as in FIG. 9) can be formed by disposing a conductive material in the lateral tunnels 860 by using a deposition process, for example, CVD, PVD, ALD, evaporation, or any combination thereof. In some embodiments, the conductive material can include tungsten (W), titanium (Ti), tantalum (Ta), aluminum, tungsten nitride (WN), titanium nitride (TiN), tantalum nitride (TaN), polysilicon, a silicide, a metal alloy or any combination thereof.

At process step S1250, a top select gate (TSG) cut (e.g., the TSG cut 220 in FIG. 10A), a slit trench (e.g, the slit trench 1066 in FIG. 10A) and a gate line slit (e.g., the gate line slit 1067 in FIG. 10B) can be formed by disposing an insulating film (e.g., the insulating film 1064 in FIGS. 10A and 10B) inside the TSG opening 620 and the slit openings 716, respectively. The insulating film 1064 can include silicon oxide, silicon nitride, silicon oxynitride, or any combination thereof. The insulating film 1064 can be deposited by CVD, PVD, ALD, sputtering, evaporating, etc.

In some embodiments, the slit openings 716 can have various widths. Some of the slit openings 716 can have a width larger than the width "$w_1$" of the TSG opening 620. In this example, a thickness of the insulating film 1064 can be chosen such that the slit trench 1066 can be formed in the slit opening 716 and the TSG cut 220 can be formed in the TSG opening 620 simultaneously. In this example, the TSG opening 620 is completed filled by the insulating film 1064 while the insulating film 1064 covers a sidewall of the slit opening 716.

In some embodiments, slit openings 716 can have various widths, where some slit openings 718 can have smaller width that others. In this example, the thickness of the insulating film 1064 can be chosen such that the insulating film 1064 can completely fill both the TSG opening 620 and some of the narrower slit openings 716. As a result, the gate line slit 1067 and the TSG cut 220 can be formed simultaneously. In some embodiments, a planarization process, for example chemical mechanical polishing, can be used to remove excess insulating film 1064 outside the TSG openings 620 and slit openings 716 and form a planarized top surface.

In some embodiments, after deposition, an anisotropic etching process (e.g., RIE) can be performed to remove the insulating film 1064 from the bottom of the slit trench 1066 and expose at least a portion of the substrate 330 or the doped source line region 344. The insulating film 1064 on a top surface of the film stack 335 of alternating conductive and dielectric layers can be removed simultaneously during the anisotropic etching process.

At process step S1260, a conductive material can be disposed in the slit trench 1066 to form a conductive core (e.g., the conductive core 1170) of an array common source (ACS) (e.g., the ACS 1168 in FIG. 11). In some embodiments, the conductive core 1170 can include tungsten (W), aluminum (Al), titanium (Ti), titanium nitride (TiN), tungsten nitride (WN), tantalum (Ta), tantalum nitride (TaN), polycrystalline silicon, a metal alloy, a silicide or any combination thereof. In some embodiments, the conductive core 1170 can be disposed by CVD, PVD, ALD, sputtering, evaporation, or any combination thereof.

In some embodiments, a planarization process (e.g., chemical mechanical polishing) can be used to remove the conductive material outside the slit trench 1066 and form a planar structure.

In summary, the present disclosure describes various embodiments of a 3D memory device and methods of making the same.

One aspect of the present disclosure provides a method for forming a three-dimensional (3D) memory device that includes forming an alternating dielectric stack on a substrate. The method also includes forming a plurality of channel holes, wherein the plurality of channel holes penetrate the alternating dielectric stack vertically, in a direction perpendicular to the substrate, and expose at least a portion of the substrate. The method further includes forming a plurality of top select gate openings penetrating vertically an upper portion of the alternating dielectric stack and extending laterally in a direction parallel to the substrate. The method also includes forming a plurality of slit openings parallel to the plurality of top select gate openings, wherein the plurality of slit openings penetrate vertically the alternating dielectric stack and expose at least a portion of the substrate. The method further includes replacing the alternating dielectric stack with a film stack of alternating conductive and dielectric layers, forming a plurality of top select gate cuts in the plurality of top select gate openings, and forming a plurality of slit structures in the plurality of slit openings.

Another aspect of the present disclosure provides a three-dimensional (3D) memory device that includes a film stack of alternating conductive and dielectric layers disposed on a substrate. The 3D memory device also includes a plurality of memory strings and slit structures extending vertically, in a direction perpendicular to the substrate, penetrating through the film stack of alternating conductive and dielectric layers, wherein the plurality of slit structures extend laterally, in a direction parallel to the substrate and the plurality of memory strings are arranged in rows, each row of memory strings staggered from adjacent rows of memory strings. The 3D memory device further includes two or more top select gate cuts disposed between adjacent slit structures, wherein the two or more top select gate cuts penetrate vertically through an upper portion of the film stack of alternating conductive and dielectric layers, and wherein the two or more top select gate cuts extend parallel to the plurality of slit structures.

The foregoing description of the specific embodiments will so fully reveal the general nature of the present disclosure that others can, by applying knowledge within the skill of the art, readily modify and/or adapt, for various applications, such specific embodiments, without undue experimentation, and without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
a film stack of alternating conductive and dielectric layers disposed on a substrate;
memory strings and slit structures extending in a first direction perpendicular to the substrate, penetrating through the film stack of alternating conductive and dielectric layers, wherein:
the slit structures extend laterally in a second direction parallel to the substrate; and
the memory strings are arranged in rows, each row of memory strings being staggered from adjacent rows of memory strings; and
at least two top select gate cuts disposed between adjacent slit structures and filled with an insulating film, wherein each top select gate cut of the at least two select gate cuts:
comprises a width smaller than a diameter of the memory strings;
penetrates through an upper portion of the film stack in the first direction; and
extends parallel to the slit structures.

2. The 3D memory device of claim 1, wherein the insulating film covers sidewalls of the slit structures.

3. The 3D memory device of claim 2, wherein at least one of the slit structures further comprises a conductive core, and wherein the conductive core is in contact with a doped region within the substrate.

4. The 3D memory device of claim 1, wherein the slit structures extend between the rows of memory strings and are configured to divide a memory block into memory fingers.

5. The 3D memory device of claim 4, wherein the top select gate cuts are configured to divide each memory finger into memory slices, each memory slice comprising two or more rows of the memory strings.

6. The 3D memory device of claim 5, wherein each memory slice is controlled independently by a top select gate formed by the conductive layers in the upper portion of the film stack.

7. A three-dimensional (3D) memory device, comprising:
a film stack of alternating conductive and dielectric layers disposed on a substrate;
memory strings penetrating through the film stack in a first direction perpendicular to the substrate;
a slit structure penetrating through the film stack in the first direction and extending in a second direction parallel to the substrate; and
at least two top select gate cuts penetrating through an upper portion of the film stack in the first direction and extending in the second direction, wherein each top select gate cut of the at least two top select gate cuts comprises an insulating film of a same material and a width smaller than a diameter of the memory strings.

8. The 3D memory device of claim 7, wherein the film stack comprises conductive and dielectric layer pairs, and wherein each conductive and dielectric pair comprises a dielectric layer and a conductive layer.

9. The 3D memory device of claim 8, wherein the top select gate cuts penetrate through a top three conductive and dielectric pairs of the film stack.

10. The 3D memory device of claim 7, wherein the top select gate cuts are filled with the insulating film.

11. The 3D memory device of claim 7, wherein the insulating film covers a sidewall of the slit structure.

12. The 3D memory device of claim 7, wherein the insulating film comprises silicon oxide, silicon nitride, silicon oxynitride, or a combination thereof.

13. The 3D memory device of claim 7, wherein the slit structure further comprises a conductive core, and wherein the conductive core is in contact with a doped region within the substrate.

14. The 3D memory device of claim 13, wherein the conductive core comprises tungsten (W), aluminum (Al), titanium (Ti), copper (Cu), cobalt (Co), nickel (Ni), titanium nitride (TiN), tungsten nitride (WN), tantalum (Ta), tantalum nitride (TaN), AlTi, polycrystalline silicon, or a combination thereof.

15. The 3D memory device of claim 7, wherein each of the memory strings comprises:
 a core filling film disposed in a center of each of the memory strings;
 a channel layer covering a sidewall of the core filling film; and
 a memory film covering a sidewall of the channel layer.

16. The 3D memory device of claim 7, wherein the memory strings are arranged in rows on a plane parallel to the substrate, each row of memory strings being staggered from adjacent rows of memory strings.

17. The 3D memory device of claim 16, wherein the slit structure and the top select gate cuts extend between the rows of memory strings and are distant from the memory strings.

18. The 3D memory device of claim 16, wherein the slit structure is configured to divide a memory block into memory fingers.

19. The 3D memory device of claim 16, wherein the top select gate cuts are configured to divide each memory finger into memory slices, each memory slice comprising two or more rows of memory strings.

20. The 3D memory device of claim 7, wherein the top select gate cuts extend in the second direction with a wavy shape.

* * * * *